United States Patent [19]

Black

[11] Patent Number: 4,796,070
[45] Date of Patent: Jan. 3, 1989

[54] LATERAL CHARGE CONTROL SEMICONDUCTOR DEVICE AND METHOD OF FABRICATION

[75] Inventor: Robert D. Black, Clifton Park, N.Y.

[73] Assignee: General Electric Company, Schenectady, N.Y.

[21] Appl. No.: 3,678

[22] Filed: Jan. 15, 1987

[51] Int. Cl.[4] .................... H01L 29/06; H01L 29/78; H01L 29/40

[52] U.S. Cl. .................... 357/23.4; 357/55; 357/53; 357/23.8

[58] Field of Search .................... 357/23.4, 23.8, 55, 357/53

[56] References Cited

U.S. PATENT DOCUMENTS

| | | | |
|---|---|---|---|
| 3,413,527 | 11/1968 | Davies | 357/53 |
| 3,855,608 | 12/1974 | George et al. | 357/22 |
| 3,953,879 | 4/1976 | O'Connor-D'Arlach et al. | 357/22 |
| 4,290,078 | 9/1981 | Ronen | 357/23.4 |
| 4,393,391 | 7/1983 | Blanchard | 357/23.4 |
| 4,422,089 | 12/1983 | Vaes et al. | 357/23.4 |
| 4,502,914 | 3/1985 | Trumpp et al. | 357/49 |
| 4,589,193 | 5/1986 | Goth et al. | 357/52 |
| 4,626,879 | 12/1986 | Colak | 357/23.4 |

OTHER PUBLICATIONS

Hu, Chenming, "A Parametric Study of Power MOS-FETS" 10th Power Electronics Specialists Conference, Record, Held Jan. 18–22, 1979, pp. 385–395.

Primary Examiner—Andrew J. James
Assistant Examiner—Jerome Jackson, Jr.
Attorney, Agent, or Firm—Robert Ochis; James C. Davis, Jr.; Marvin Snyder

[57] ABSTRACT

A lateral charge control semiconductor device is disclosed wherein a plurality of gate filled trenches are disposed in side-by-side relation within a partially processed semiconductor wafer to define finger portions of a drain region therebetween. A field plate is disposed on the upper surface of the finger portions and a portion of the partially processed wafer is situated beneath the finger portions. Charge control can thus be provided to all surface of the finger portion of the lateral device to maximize the amount of charge control which can be applied to the device. More particularly, the carrier concentration within the finger portion can be increased to reduce the one-resistance of the device during forward conduction, while in a reverse blocking operation, lateral charge control can be applied to couple to the electric field originating with the ionized impurities situated in the drift/drain region to increase the breakdown voltage of the device.

19 Claims, 22 Drawing Sheets

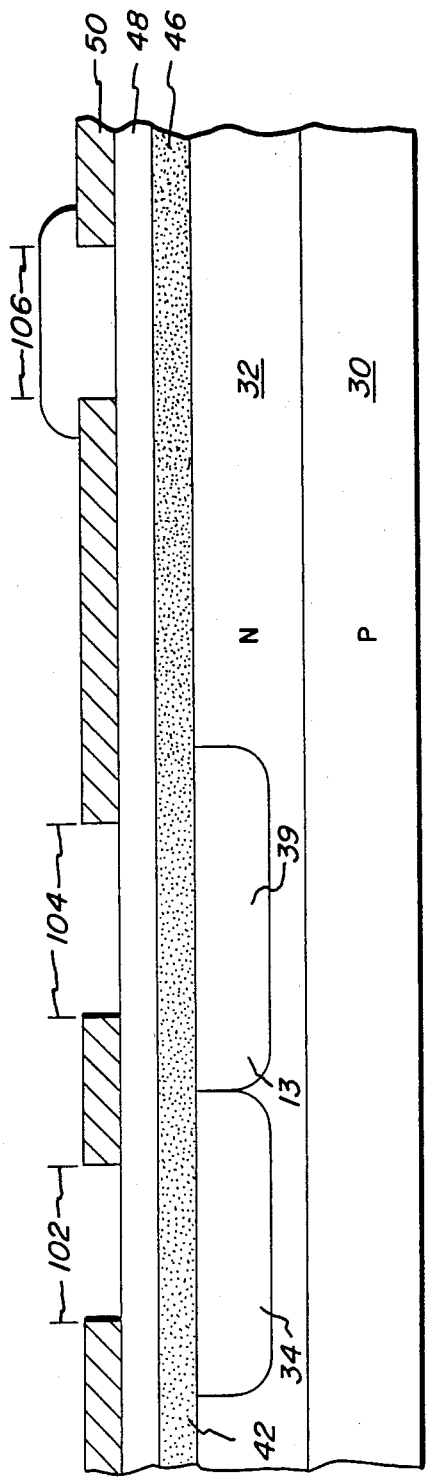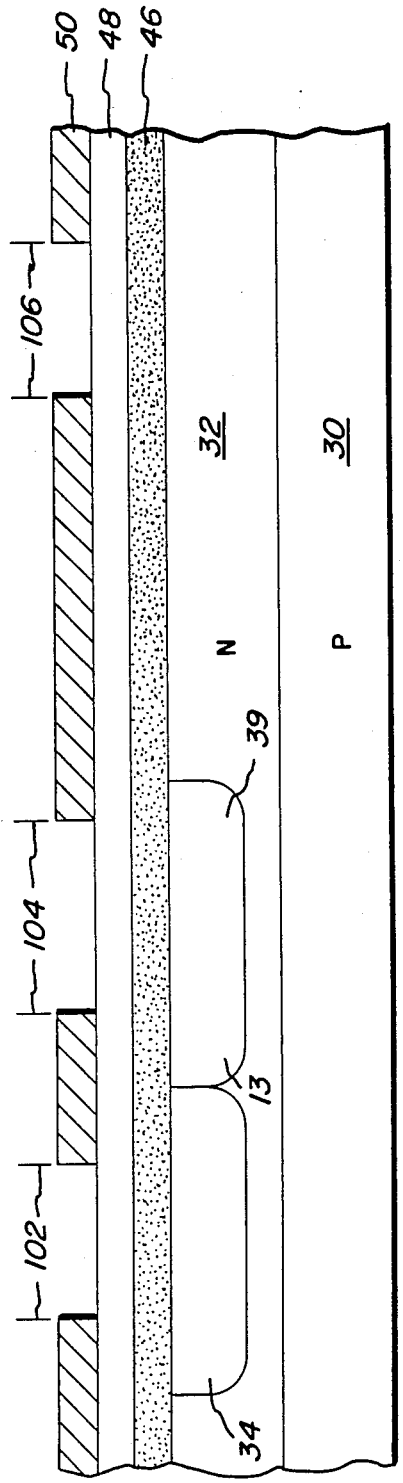

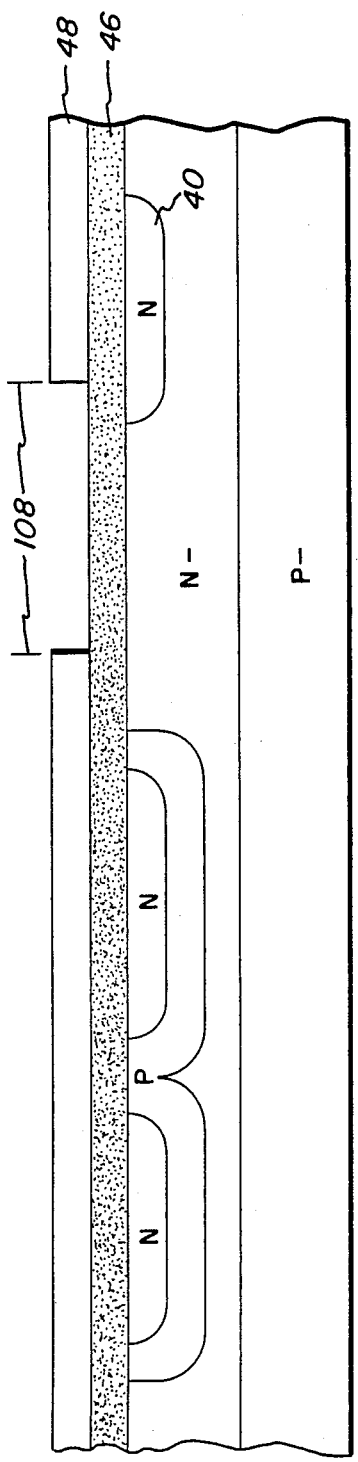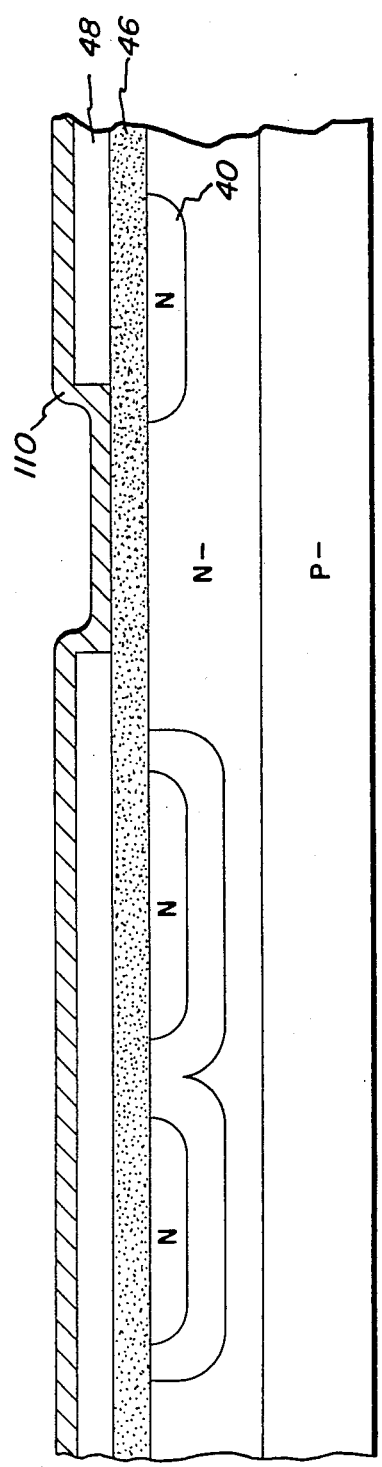

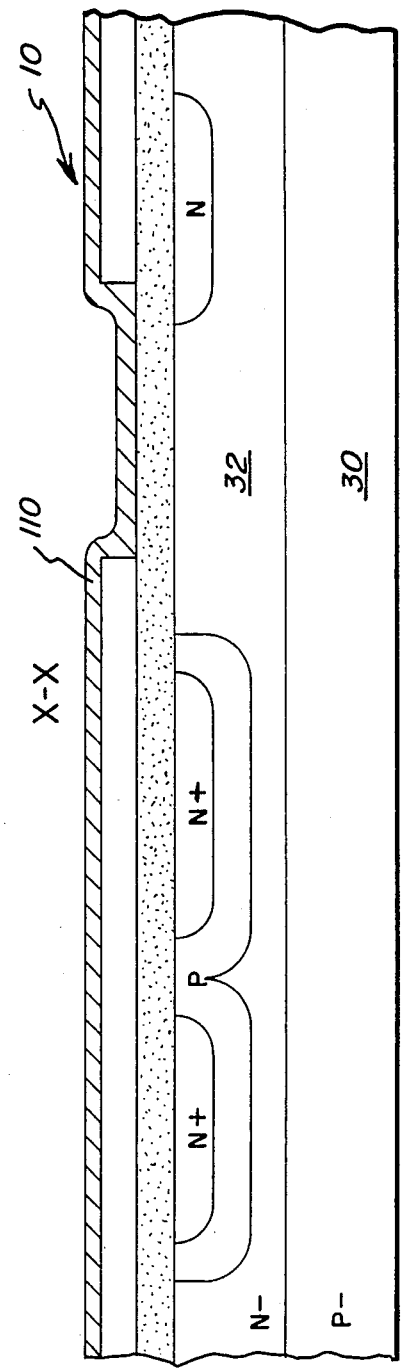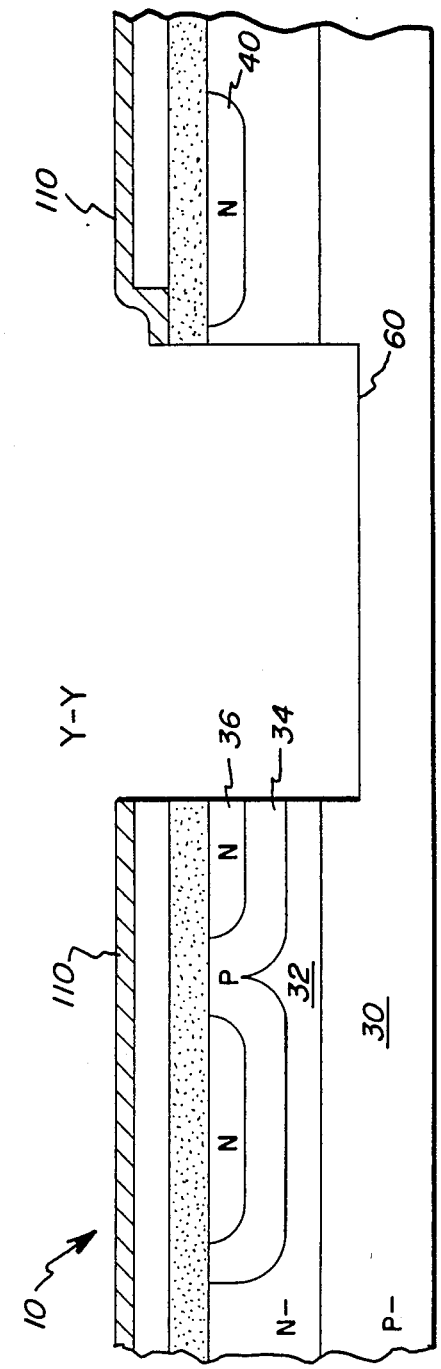
FIG. 22
FIG. 23

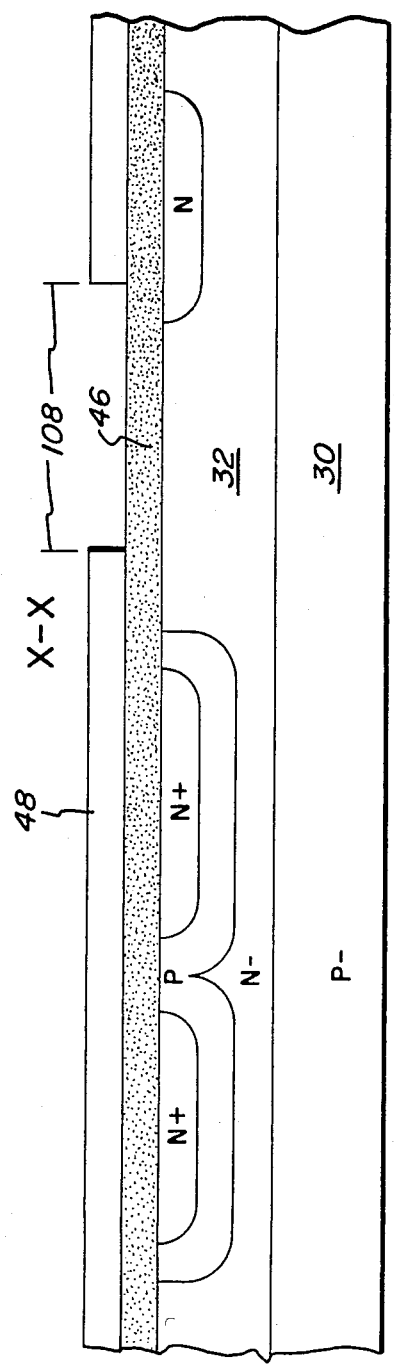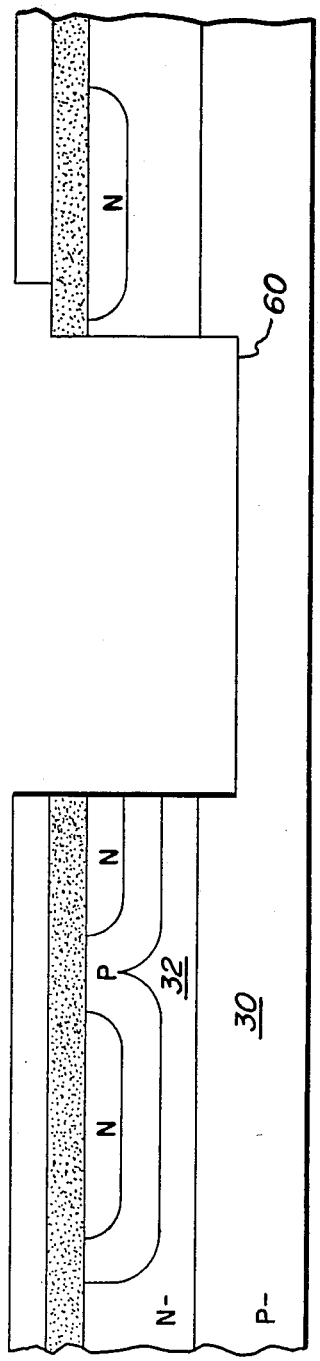

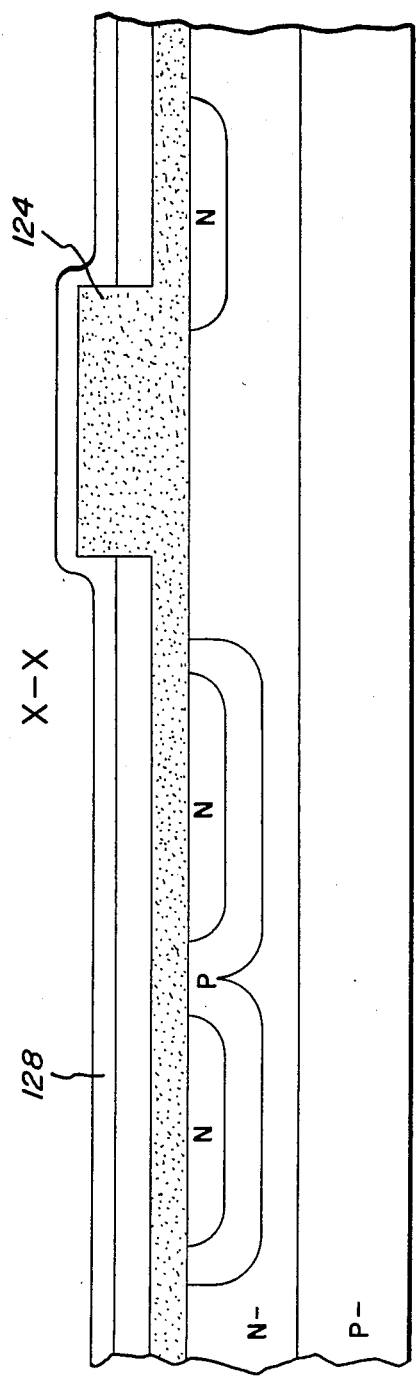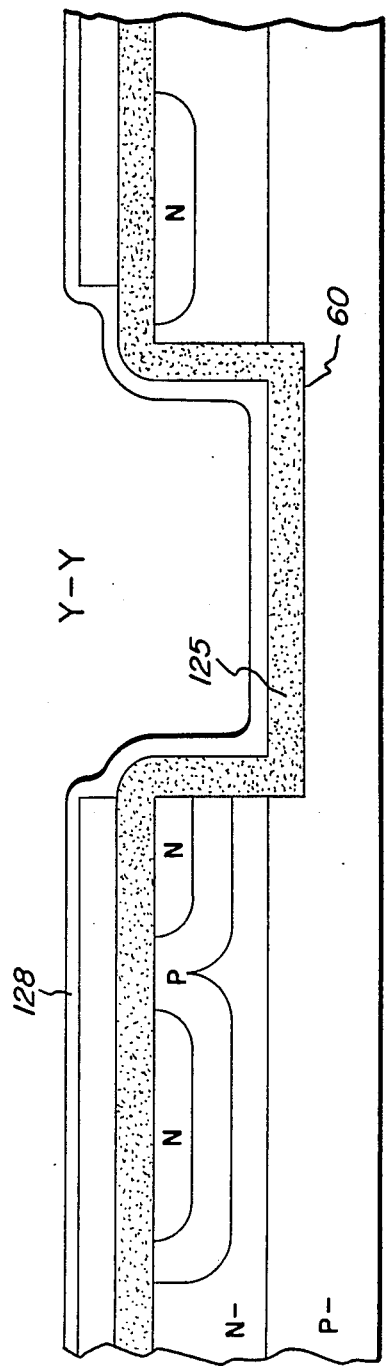

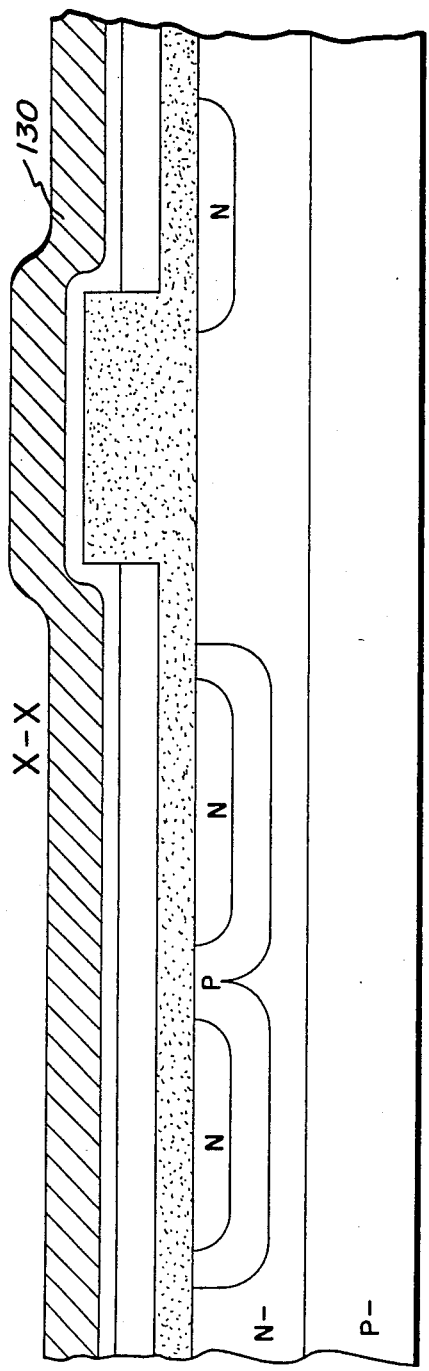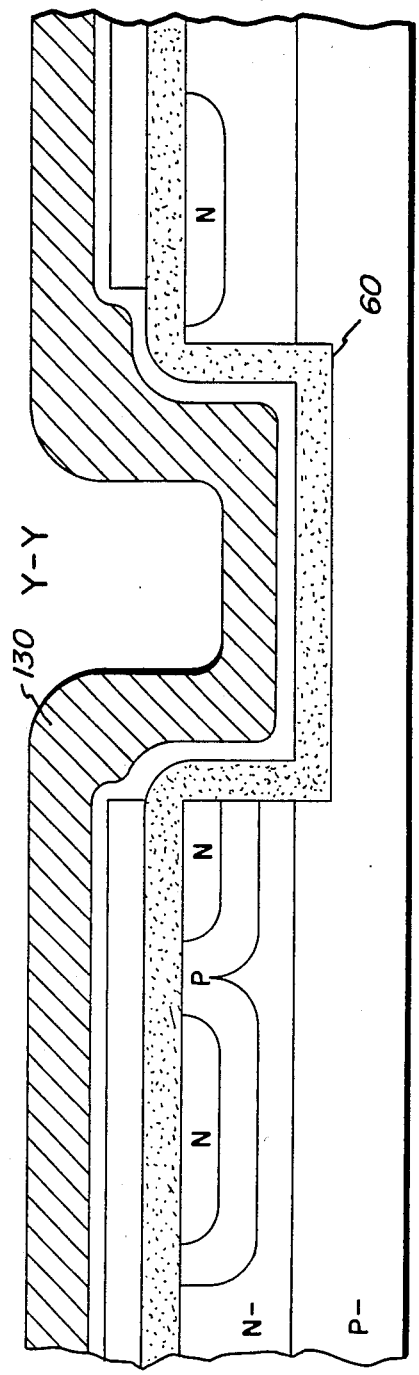
FIG. 30
FIG. 31

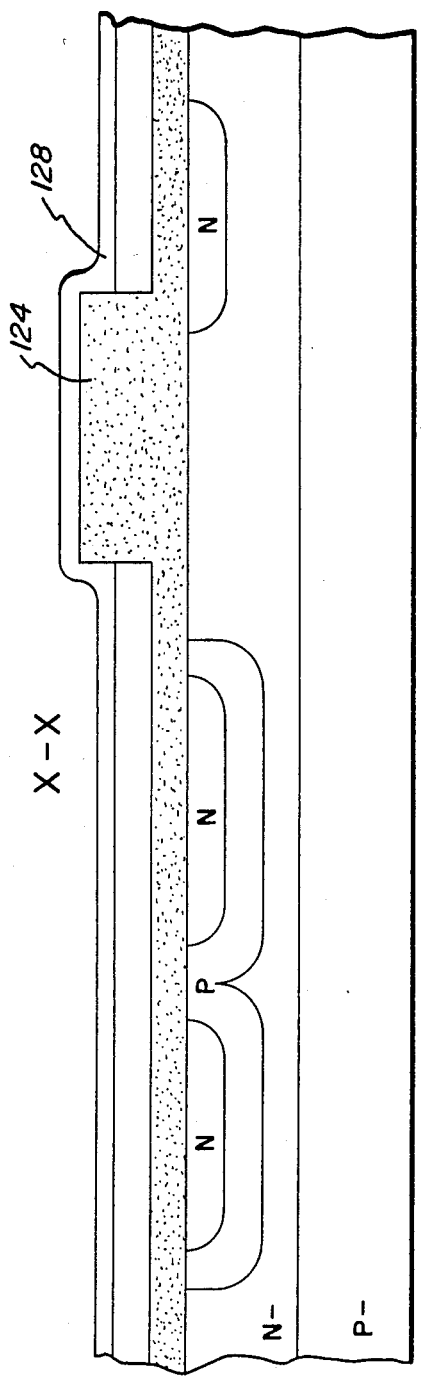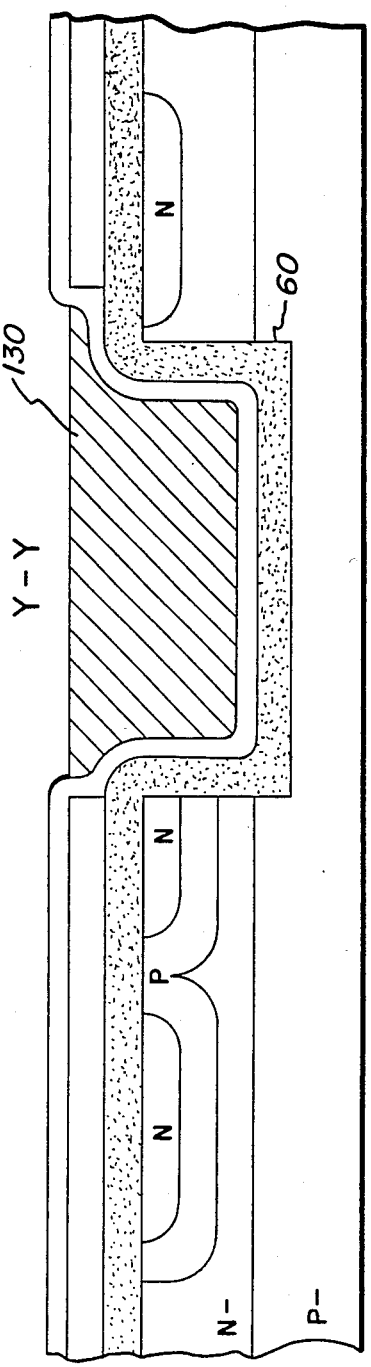

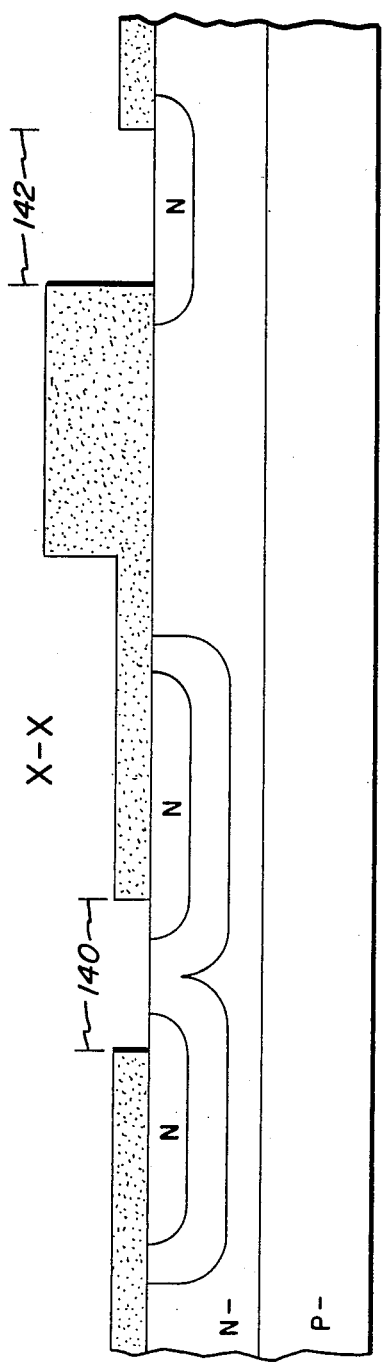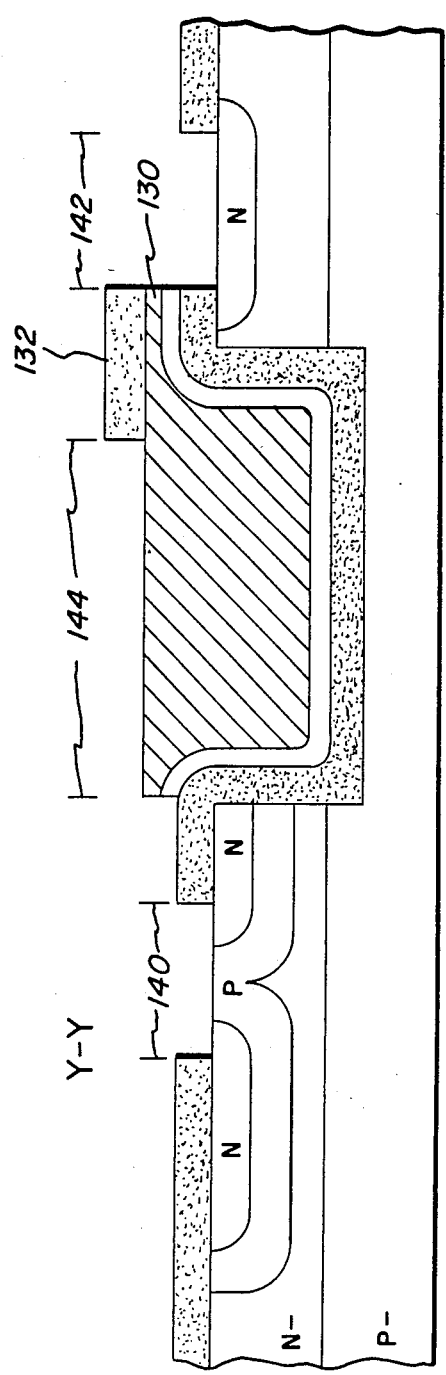

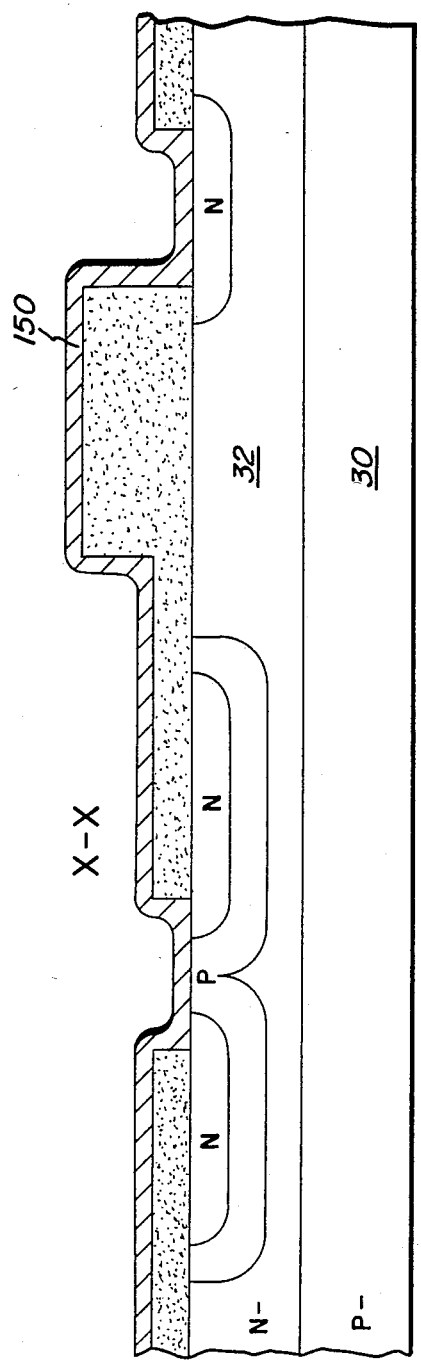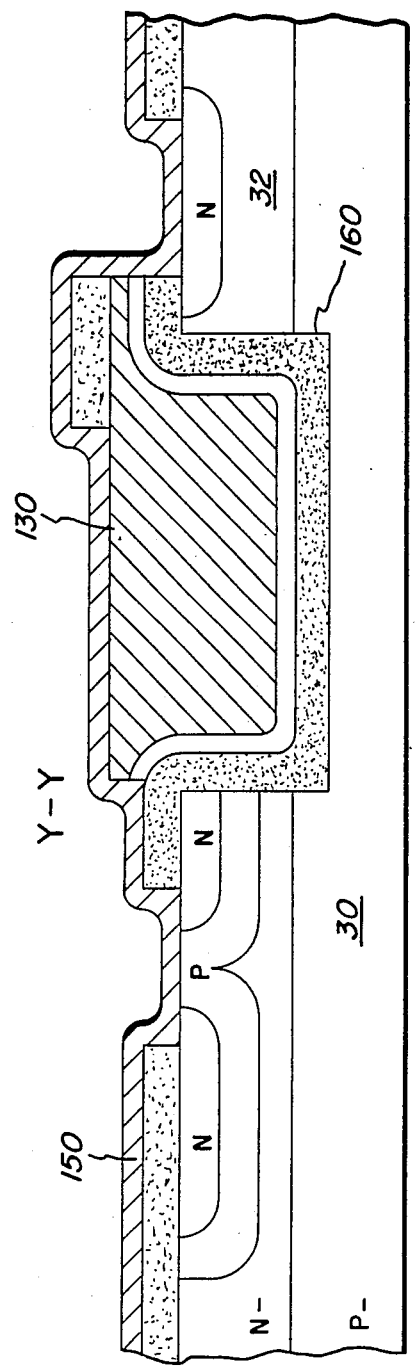

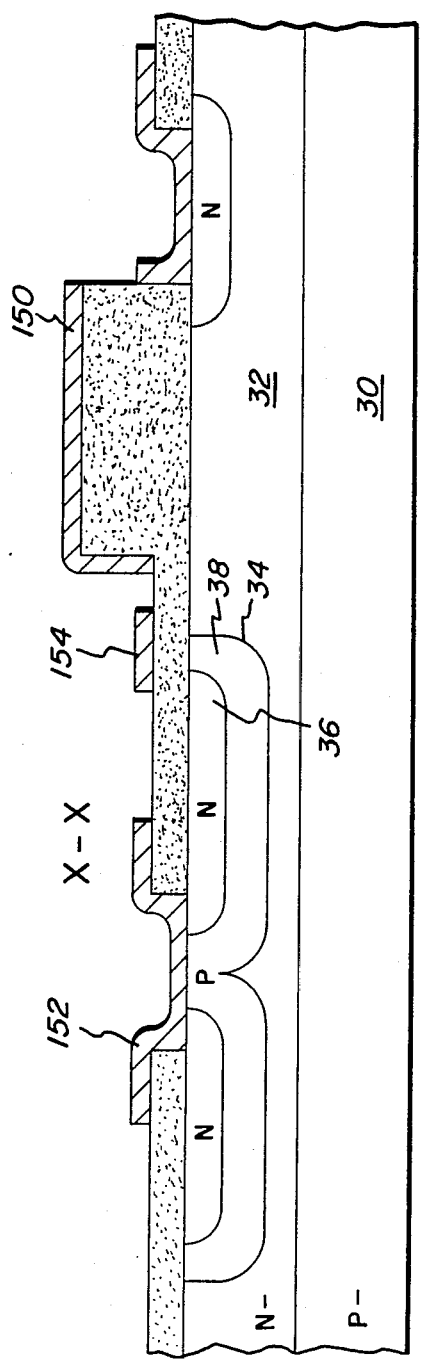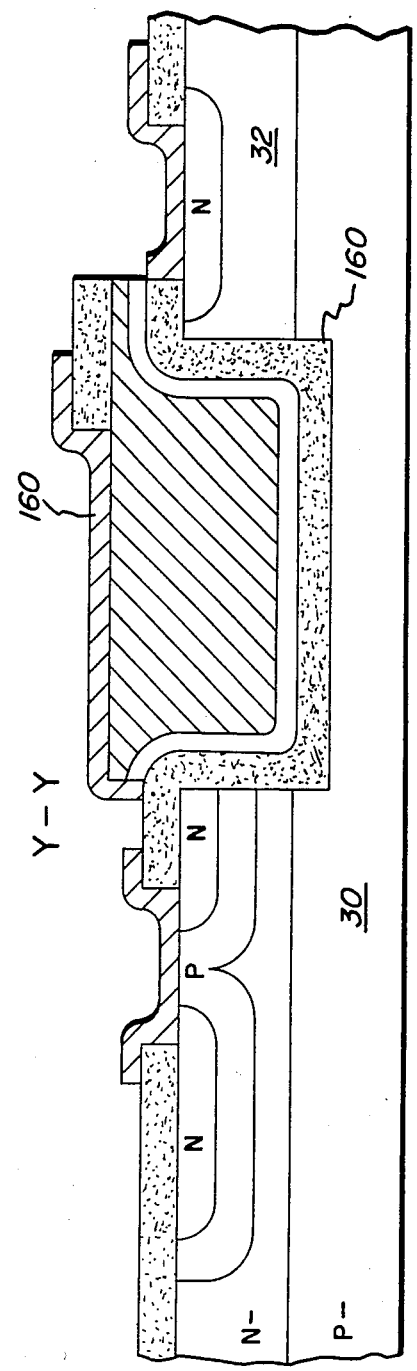
FIG. 42
FIG. 43

LATERAL CHARGE CONTROL SEMICONDUCTOR DEVICE AND METHOD OF FABRICATION

This application is related to the following copending applications: "Improved Semiconductor Devices Exhibiting Minimum On-Resistance", Ser. No. 938,692 and "Method of Fabricating a Semiconductor Device Exhibiting Minimum On-Resistance", Ser. No. 938,666 both filed on Dec. 5, 1986 in the name of V. A. K. Temple and assigned to the assignee hereof and the totality of each of which is incorporated herein by reference.

This application relates to semiconductor devices and more specifically, to a lateral charge control insulated gate semiconductor device exhibiting low on-resistance. The improved insulated gate semiconductor structure can be used to provide improved semiconductor devices such as a metal oxide semiconductor field effect transistor (MOSFET).

BACKGROUND OF THE INVENTION

A vertical charge control semiconductor device is disclosed in the above-referenced patent applications wherein a trench extends through a first or base layer of the device and a substantial distance into the second or drift layer of the device. More particularly, these applications specify that the vertical charge control device exhibit an aspect ratio in the second or drift layer (which is defined as the ratio of the depth of the trench to the width of the pedestal defined by the trench) which is greater than or equal to 0.5. These vertical devices intended to have a breakdown voltage in excess of 400 volts require the establishment of a substantially vertical trench having a depth greater than or equal to 10 microns. Various process difficulties have been discovered in the course of fabricating trenches of these depths and it has not always been possible to accurately provide a trench of desired depth. Thus it is not possible to use standard vertical charge control techniques to achieve a device which exhibits a breakdown voltage in excess of 400 volts. Further, it has not been possible to provide vertical charge control devices which exhibit consistent performance within a desired high voltage range.

Accordingly, it is desirable to provide a lateral charge control semiconductor device which does not employ a deep trench and thus is not susceptible to the difficulties associated with providing a deep trench.

Objects of the Invention

A principal object of the present invention is to provide a lateral charge control semiconductor device having a breakdown voltage in excess of 400 volts.

It is therefore an object of the present invention to provide an improved lateral charge control semiconductor device in which the source and drain regions are disposed in opposed relationship within a first layer and a trench also situated in the first layer is disposed therebetween.

It is a further object of the present invention to provide a lateral charge control device in which the device operating parameters are less interrelated and are preferably decoupled from each other.

It is a further object of the present invention to provide a lateral charge control device in which the on-resistance of the device can be adjusted substantially independent of the lateral breakdown voltage to therefore provide a minimum on-resistance high breakdown voltage device.

A principal object of the present invention is to provide a new and improved insulated gate semiconductor device capable of controlling a forward current of relatively high magnitude in comparison to the magnitude of the forward current controlled by a conventional device of approximately the same dimension and breakdown voltage.

A further object of the present invention is to provide a lateral charge control semiconductor device in which the device breakdown voltage is substantially independent of the drift region doping concentration.

A still further object of the present invention is to provide a lateral charge control semiconductor device in which the carrier concentration in the blocking region is inversely proportional to the width of the pedestal.

SUMMARY OF THE INVENTION

These and other objects and features of the present invention are achieved in a lateral charge control semiconductor device, which in a preferred embodiment, comprises a semiconductor wafer including first and second layers of semiconductor material. The first layer can be of one type conductivity semiconductor material and the second layer can be of an opposite type conductivity semiconductor material. A first region of one type conductivity is disposed within the second layer and a second region of opposite type conductivity is disposed within the first region. The second region, in combination with the second layer, defines a channel portion of the first region. A third region of opposite type conductivity is also disposed within the second layer and is situated in opposed relation with the first and second regions. A plurality of trenches are disposed in substantially parallel side-by-side relation within the second layer and define finger portions of the second layer therebetween. The trenches preferably extend through the second layer and into the first layer to impinge upon and extend through the first, second and third regions. A first insulated gate structure can be disposed in each of the trenches and a second insulated gate structure can be disposed atop the second layer proximate the channel portion of the first region. In addition, an insulated field plate can be disposed atop finger portions of the second layer situated in the interstices of the second layer. In addition, an electrode can be attached to the first layer to thus enable the drift region portion of the second layer to be subjected to charge control on all four sides. More particularly, the field plate provides charge control from the upper surface of the device, the gate structures disposed within the trenches provide charge control from the side surfaces of the fingers and the first layer provides charge control from the bottom surface of the finger.

The first and second regions are preferably semi-cylindrical in cross-section and respectively have first and secondary primary axes extending in a longitudinal direction. It is preferred that the first and secondary primary axes be substantially parallel and that the primary axis of the trench be substantially transverse to the primary axis of either the first or second layer. Adjacent trenches are preferably disposed in a side-by-side relationship whereby the adjacent trenches define a finger-like pedestal portion of the first layer of the device. It is also preferred that the ratio of the width of the pedestal to the width of the trench be approximately greater than or equal to one. The first and third regions preferably extend into the first layer to first and second depths, respectively. It is preferred that the trench extend to a depth which is substantially greater than either the first or second depth.

In an alternate preferred aspect of the present invention, a method of fabricating a lateral charge control semiconductor device is provided comprising the following steps. Initially, a wafer of semiconductor material is provided. The wafer is preferably partially processed and comprises first and second layers. The first layer can be of a one type conductivity and the second layer can be of opposite type conductivity. The second layer can, for instance, be established by epitaxial growth on top of the first layer or alternatively, by diffusion of one type conductivity dopants into the first layer. A first protective layer is established atop the first layer and can, for instance, comprise a nitride layer atop an oxide layer. Thereafter, a temporary protective layer, such as polysilicon layer, can be provided atop the nitride layer. Photolithographic techniques can be used in combination with an external mask of desired configuration to open a first window through the temporary protective layer to expose a first portion of the surface of the first protective layer. One type conductivity dopants can be introduced into the second layer to establish a first region of one type conductivity within the second layer which region extends beneath the first protective layer. It is preferred that one type conductivity dopant such as boron impurities be implanted through the nitride and oxide layers comprising the first protective layer to establish the first region. Subsequently, a second window is opened through the temporary protective layer to expose a second portion of the surface of the first protective layer. The first window remains open. Opposite type conductivity dopants are then introduced into the second layer through the first and second windows by, for instance, implantation techniques to establish a second region within the first region and a third region within the second layer.

Thereafter, photolithographic techniques are employed in combination with an appropriate etch to remove the temporary protective layer and the nitride portion of the first protective layer from the surface of the device situated between the first and third regions and more proximate the third region. This region is referred to as the extended drain region of the device. Thereafter, the remainder of the temporary protective layer is removed and a suitable masking layer such as an aluminum layer is deposited. Photolithographic techniques can be used to pattern the masking layer to allow the patterned layer to serve as a mask which is resistant to a reactive ion etch which will be subsequently used to etch the trench. Subsequently, a reactive ion etch is used to etch through the unmasked portion of the first protective layer as well as the underlying portion of the first layer and first and second regions to form a trench. Thereafter, the masking layer is removed. A thick thermal oxide, approximately 800 nanometers in thickness is then grown on the exposed surface of the device. A nitride layer of approximately 100 nanometers is then deposited atop the oxide layer. The etched trenches are then filled with polysilicon. The deposited polysilicon is then patterned using photolithographic techniques to define and mask a gate contact strip. Subsequently, the unmasked polysilicon is replanarized. Thereafter, the exposed surface of the polysilicon is oxidized. The nitride layers are removed and contact windows are cut through the oxide layer which forms a portion of the first protective layer as well as the oxide layer grown on top of the polysilicon. Contact windows are provided for the source, drain, field plate and trench poly regions. A metallization layer is applied to the surface of the device and subsequently, the metallization layer is patterned to provide for a source contact, a drain contact, a field plate contact, a trench poly contact as well as an insulated gate situated approximate the channel portion of the first region.

Thus, a lateral charge control semiconductor device has been provided which provides charge control on all four surfaces of the drift region. The trench provides charge control on either side of the drift finger while the field or charge control plate formed atop the extended drain portion of the finger provides charge control on a third side, and the P substrate provides charge control on the fourth side of the finger. In the blocking state, the source, gate and plate contacts are shorted together with the substrate being necessarily at a negative potential. In the conducting state, the gate is positively biased with respect to the source. Thus, a lateral charge control device having a breakdown voltage in excess of 400 volts can be achieved.

BRIEF DESCRIPTION OF THE DRAWINGS

The features of the present invention which are believed to be novel are specified with particularity in the appended claims. The invention itself, however, both as to organization and method of operation together with additional objects, features and advantages of the lateral charge control semiconductor device and method of fabrication can be best understood by reference to the following detailed description when taken in conjunction with the accompanying drawings in which:

FIGS. 8-18 are cross-sectional illustrations of a lateral charge control semiconductor device during successive stages of processing of a semiconductor device in accordance with the method of the present invention;

FIGS. 20, 22, 24, 26, 28, 30, 32, 34, 36, 38, 40 and 42 are illustrations of a portion of a single cell of a lateral charge control device during successive stages of processing as might be found in the processing of the device of FIG. 4 taken along section x—x;

FIGS. 21, 23, 25, 27, 29, 31, 33, 35, 37, 39, 41 and 43 are cross-sectional illustrations of a portion of a single cell of a lateral charge control semiconductor device during successive stages of processing in accordance with a method of the present invention as may be seen in a view taken along lines y—y of FIG. 4.

DETAILED DESCRIPTION OF THE PREFERRED EMBODIMENTS

Figure 1:
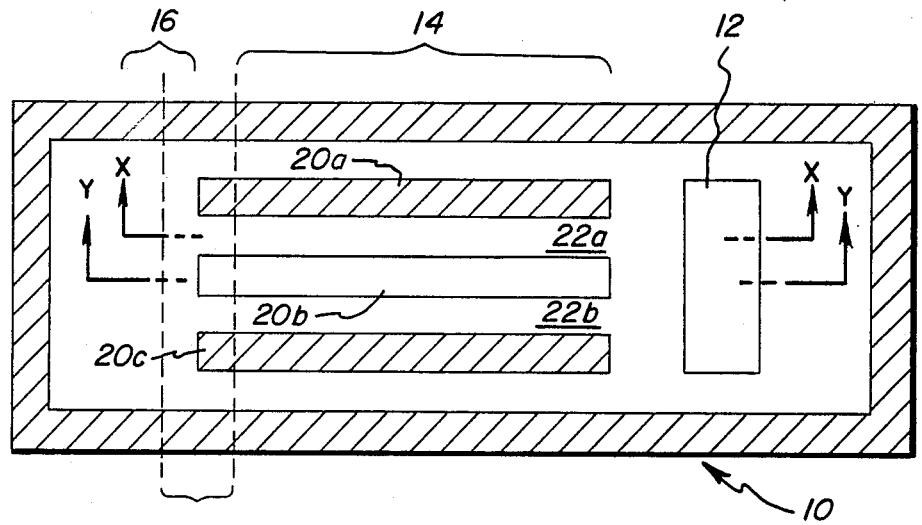
FIG. 1 is a top view of a partially processed lateral charge control semiconductor device in accordance with the present invention and prior to metallization.

The lateral charge control semiconductor device of the present invention is applicable to a broad range of semiconductor devices and can be fabricated from a variety of different materials. The ensuing description will disclose several preferred embodiments of the improved coductivity lateral charge control semiconductor device of the present invention as implemented in a silicon substrate because silicon devices or devices fabricated in silicon substrates make up an overwhelming majority of the currently available semiconductor devices. Consequently, the most commonly encountered applications of the present invention will involve silicon substrate devices. Nevertheless, it is intended that the invention disclosed herein can be advantageously employed in germanium, gallium arsenide and other semiconductor materials. Accordingly, application of the present invention is not intended to limited to devices fabricated in silicon semiconductor material, but will encompass those devices fabricated in any of a number of semiconductor materials.

Moreover, while the present description discusses a number of preferred embodiments directed to silicon substrate devices, it is intended that these disclosures be considered as illustrative examples of the preferred embodiments of the present invention and not as a limitation on the scope or applicability of the present invention. Further, concerning the lateral charge control semiconductor device structure of the present invention in connection with an enhancement mode metal oxide semiconductor field effect transistor, it is not intended that the improved insulated gate structure be limited to these devices. These devices are included to demonstrate the utility and application of the present invention to what are considered preferred commercial embodiments. Further, while the present invention provides for improved conductivity and current density, it is also recognized that the attendant benefits of reduced cell size and reduced cell repeat distance result from the lateral channels. Moreover, while certain equations may be presented in connection with the description of the present invention as an aid to understanding the operation of the present device, it should be understood that these equations apply to idealized examples and are intended to emphasize the operational principles of the present invention and should not be construed as a limitation on the scope or applicability of the present invention.

Given the corresponding relationship of FIGS. 1–43, corresponding parts have been designated with the same reference numeral as an aid to understanding the description of the present invention. Various parts of the semiconductor elements, however, have not been drawn to scale. Certain dimensions have been exaggerated in relation to other dimensions in order to present a clearer understanding of the invention. Although for the purposes of illustration, the preferred embodiments of the improved conductivity lateral charge control semiconductor device of the present invention are shown in each particular embodiment to include specific P and N type regions, it is understood by those skilled in the art that the teachings herein are equally applicable to lateral charge control devices in which the conductivities of the various regions have been reversed to, for instance, provide the dual of the illustrated device. Further although the embodiments illustrated herein are shown in two-dimensional views with various regions of the device illustrated as having length and width, it is understood that these regions are illustrations of only a portion of a single cell of a device which is comprised of a plurality of cells arranged in a three-dimensional structure. Accordingly, these regions, when fabricated in actual devices, will have three dimensions including length, width and depth.

Referring now to FIG. 1, a top plan view of a preferred embodiment of a lateral charge control semiconductor device 10 as applied to a metal oxide field effect transistor is shown. The device generally comprises a drain region 12, a drift or extended drain region 14 and a source region 16. A plurality of trenches 20 are disposed in substantially parallel side-by-side relationship within the extended drain or drift region 14 of the device 10. The device 10 also includes a trench portion 20 which extends about the perimeter of a cell and thus encompasses the drain, drift and source regions 12, 14, and 16, respectively. The drift region 14 of the device 10 can be divided into finger-like pedestal portions 22 by adjacent trenches 20. More particularly, trenches 20a and 20b define a finger portion 22a therebetween. Similarly, trench 20b and 20c define a finger portion 22b therebetween.

Figure 2:
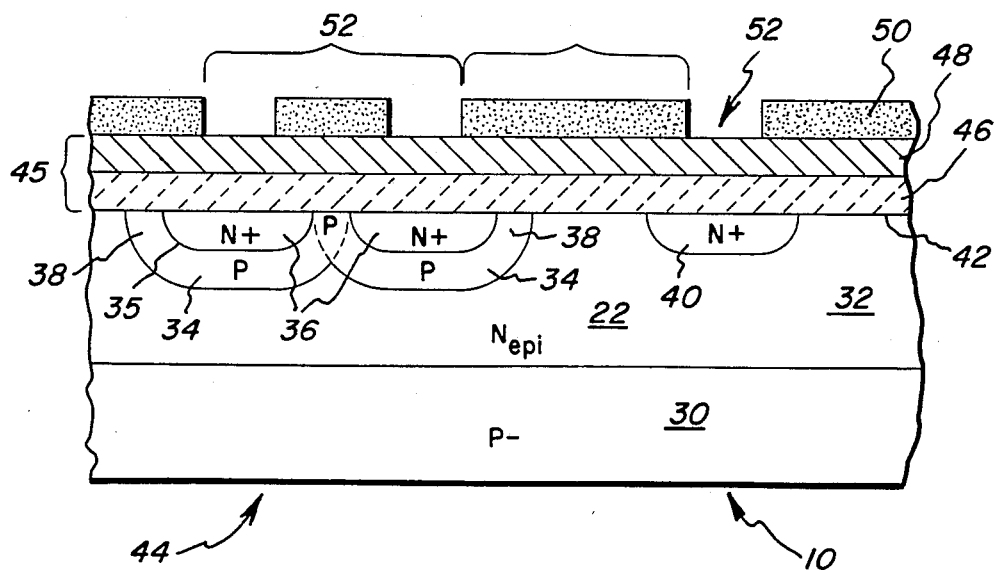
FIG. 2 is cross-sectional illustration of a portion of a single cell of a lateral charge control semiconductor device such as that shown in FIG. 1 and taken along lines x—x designated therein.

Referring now to FIG. 2, a cross-sectional illustration taken along lines x—x of FIG. 1 is shown. More particularly, the lateral charge control semiconductor device 10 of the present invention is shown to comprise a first layer 30 of one type conductivity which is illustrated as P type conductivity. A second layer 32 of opposite type conductivity and illustrated as being of N type conductivity, is disposed atop the first layer 30. The first layer 30 has a thickness of approximately 20 mils, while the second layer has a thickness of approximately 5–10 microns first region 34 of one type conductivity and illustrated as a P type region is established within the second layer 32. A second region 36 of opposite type conductivity is disposed within the first region 34 and forms a PN junction 35 with the first region. The second region 36, in combination with the second layer 32, defines a channel portion 38 of the first region 34 disposed therebetween. As illustrated in FIG. 2, the first and second regions 34 and 36 can comprise back-to-back regions to facilitate the formation of back-to-back devices. This particular configuration allows for the establishment of a pair of back-to-back lateral charge control devices (not shown).

A third region 40 illustrated as a heavily doped opposite type conductivity region and shown as an N+ region is also disposed within the second layer 32. This region 40 will subsequently function as the drain region of the device. The third region 40 is disposed in opposed relationship to the first region 34 and the third region 40, in combination with the first region 34, defines the drift or extended drain region 14 in the second layer 32 of the device 10. It is preferred that the third region 40 be separated from the first region 34 by approximately 4–6 mils.

A first surface of the device comprises a portion of the first region 34, the second region 36, the second layer 32 and the third region 40. A second surface 44 of device 10 comprises the first layer 30. A first protective layer 45 is disposed atop the first surface 42 of the device 10. The first protective layer 45 can comprise an oxide layer 46 and a nitride layer 48 disposed atop thereof. In addition, a temporary protective layer 50, such as a polysilicon layer, is disposed atop the first protective layer 45. As shown in FIG. 2, a plurality of windows 52 have been opened through the temporary protective layer 50 to facilitate the establishment of the first, second and third regions through the first protective layer 45 by, for instance, employing implantation techniques.

Figure 3:
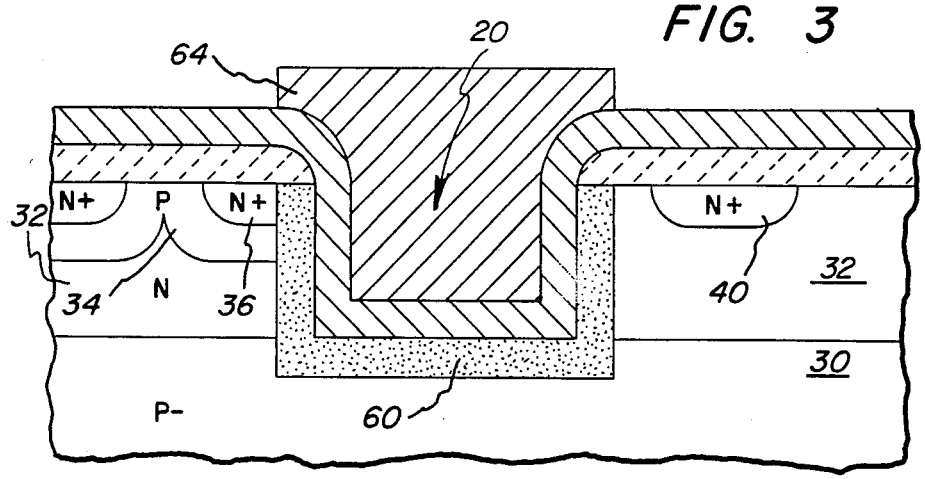
FIG. 3 is a cross-sectional illustration of a portion of a single cell of a lateral charge control semiconductor device such as that shown in FIG. 1 and taken along lines y—y therein.

Referring now to FIG. 3, a cross-sectional illustration of the lateral charge control semiconductor device 10 taken along lines y—y of FIG. 1 is shown. More particularly, a trench 20 is disposed in the first surface 42 of the device 10 and extends through the second layer 32 and into the first layer 30. The trench 20 defines the finger portions of the second layer 30 which comprise the drift or extended drain region 14 of the device 10. As shown, the trench 20 is filled with a gate material 64, such as a polysilicon, polysilicide or refractory metal material.

Thus, considering FIGS. 1, 2, and 3 together, it is seen that the lateral charge control semiconductor device of the present invention employs a plurality of trenches 20 filled with a gate material 64 which are arranged in a substantially parallel side-by-side relationship wherein the longitudinal axes of the trench are approximately parallel. The trenches define finger portions 22 of the drift region 14. By supplying an appropriate bias to the gate material 64 disposed within the trench 20, the gate material 64 can couple to the electric field originating on the ionized impurities of the second layer 32 and reorient this electric field from its conventional direction, which is normally in the direction of on-state current flow between the drain and source regions, to a new direction substantially transverse thereto. More specifically, the electric field is directed transverse to on-state current flow and to the gate material 64 to thus reduce the on-state resistance and allow the doping concentration within the second layer 32 to be increased without reducing the breakdown potential of the device 10. Further, the first, second and third regions 34, 36 and 40, respectively, are configured as semi-cylindrical regions having longitudinal axes which are substantially transverse to the longitudinal axes of the trench 20 and the drift region fingers 22.

Figure 4:
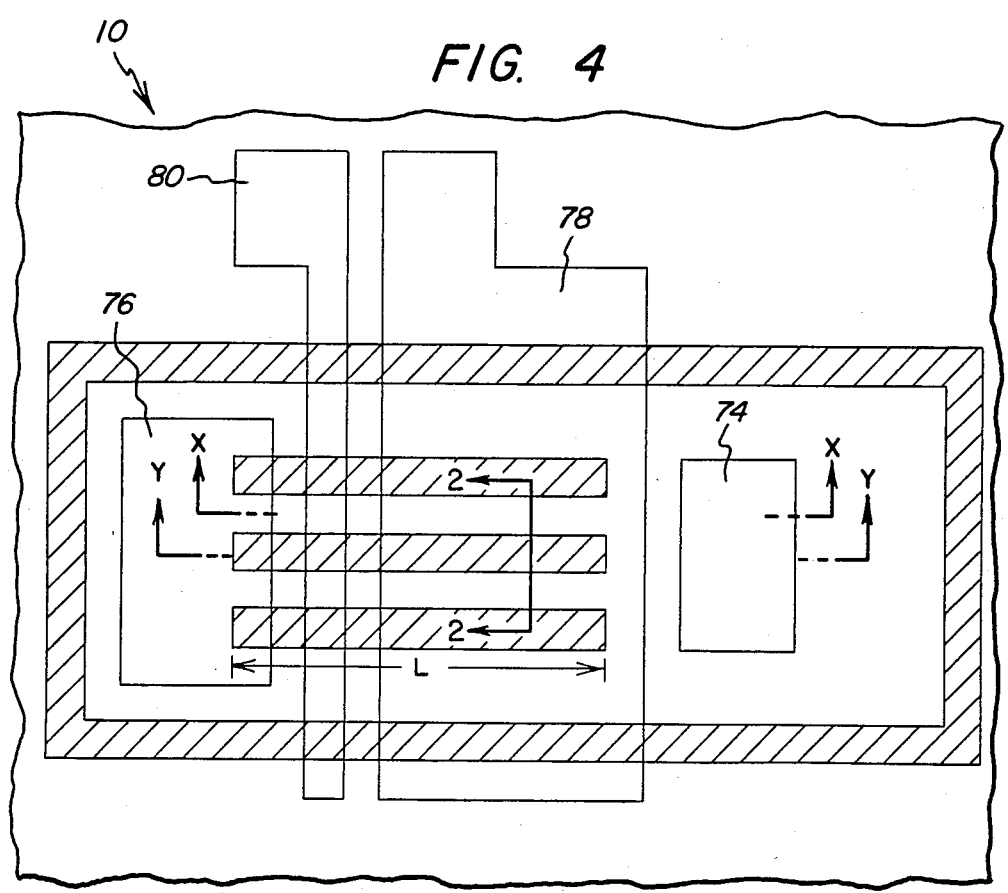
FIG. 4 is a top plan view of a lateral charge control semiconductor device in accordance with the present invention shown after metallization.

Referring now to FIG. 4, a top plan view of single cell of a semiconductor device 10 in accordance with the present invention is shown. More particularly, the drain and source regions 12 and 16 of FIG. 1 have been covered with drain and source metal regions 74 and 76, respectively. A field plate 78, such as an aluminum layer, is disposed over the trenches 20 and the fingers 22. A gate metal layer 80 is disposed over the channel portion of the first region 34.

Figure 5:
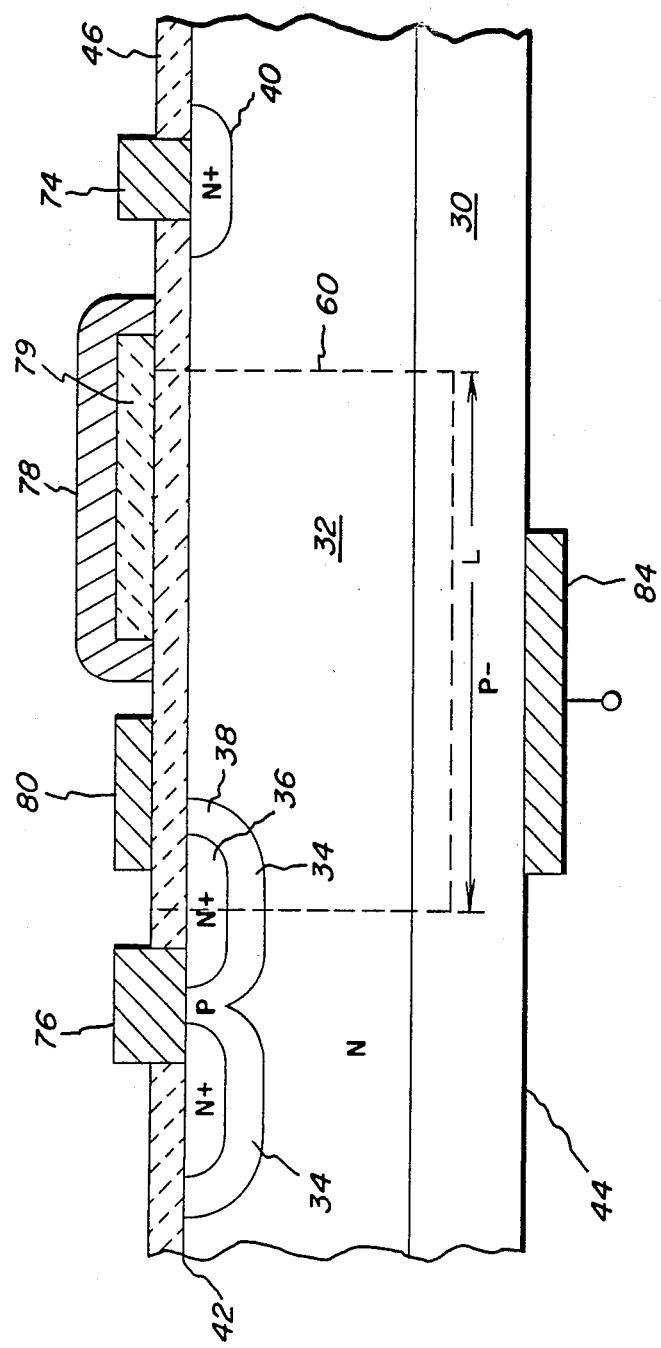
FIG. 5 is a cross-sectional illustration of a portion of a single cell of a lateral charge control semiconductor device taken along lines x—x of FIG. 4.

Referring now to FIG. 5, a cross-sectional illustration of the device of FIG. 4 is shown taken along lines x—x. More particularly, the source metal 76 is shown to be disposed in ohmic contact with the first region 34 and the second region 36. The source metal 76 thus shorts the PN junction 35 between the first and second regions 34 and 36, respectively, and serves to prevent the junction from becoming forward biased. A gate metal layer 80 is disposed atop an insulation layer 46 and is coextensive with the channel portion 38 of the first region 34. As shown, the gate metal 80 extends over a portion of the second region 36 and a portion of the second layer 32. In response to the application of an appropriate bias, the gate metal 80 establishes a channel within the channel portion 38 of the first region 34 to facilitate the conduction of opposite type conductivity carriers between the second layer 32 and the second region 36.

A field plate 78, such as an aluminum layer, is disposed over an insulation layer 79 which is situated atop the drift or drain portion 14 of the device 10 and thus provides for charge control from the upper surface 42 of the device 10. The trench area 60 is shown is phantom inasmuch as the illustration of FIG. 5 is taken along the finger portion 22 and not along a trench region 20.

A drain metal layer 74 is disposed in ohmic relation with the third region 40. A first electrode 84 is situated on the first surface 44 and is disposed in ohmic contact with the first layer 30. Thus, the first layer 30 can receive an appropriate bias to provide charge control to the finger portion of the first layer from beneath.

Figure 6:
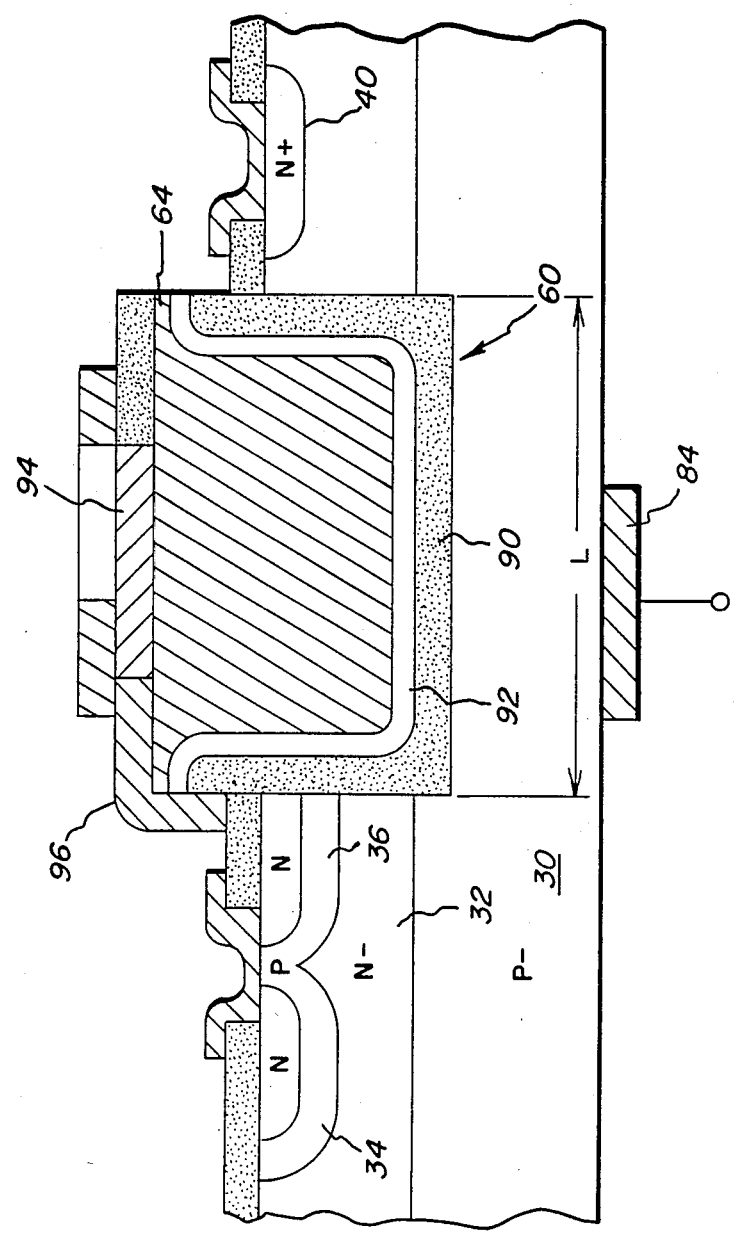
FIG. 6 is a cross-sectional illustration of a portion of a single cell of a lateral charge control semiconductor device taken along lines y—y of FIG. 4.

Referring now to FIG. 6, a cross-sectional illustration taken along lines y—y of the lateral charge control semiconductor device 10 shown in FIG. 4, is illustrated. More particularly, FIG. 6 illustrates the trench 20 which extends through the second layer 32 and into a portion of the first layer 30. In a preferred embodiment, the trench 20 cuts through a portion of the first and second regions 34 and 36, respectively. The trench 20 can be coated with a first insulating layer 90, such as a silicon dioxide layer, which can be grown on the exposed surface of the trench 20 as well as a second passivating and insulating layer 92 which can be deposited on the insulation layer 90. A polysilicon material 64 is deposited within the trench 26 atop the passivating layer 92 and the insulating layer 90. The upper surface of the gate material 64 can be oxidized and a second protective layer 94 can be formed thereon. A window can be opened through the second protective layer 94 and a metallization layer 96 can be disposed in ohmic contact with the gate material 64.

Figure 7:
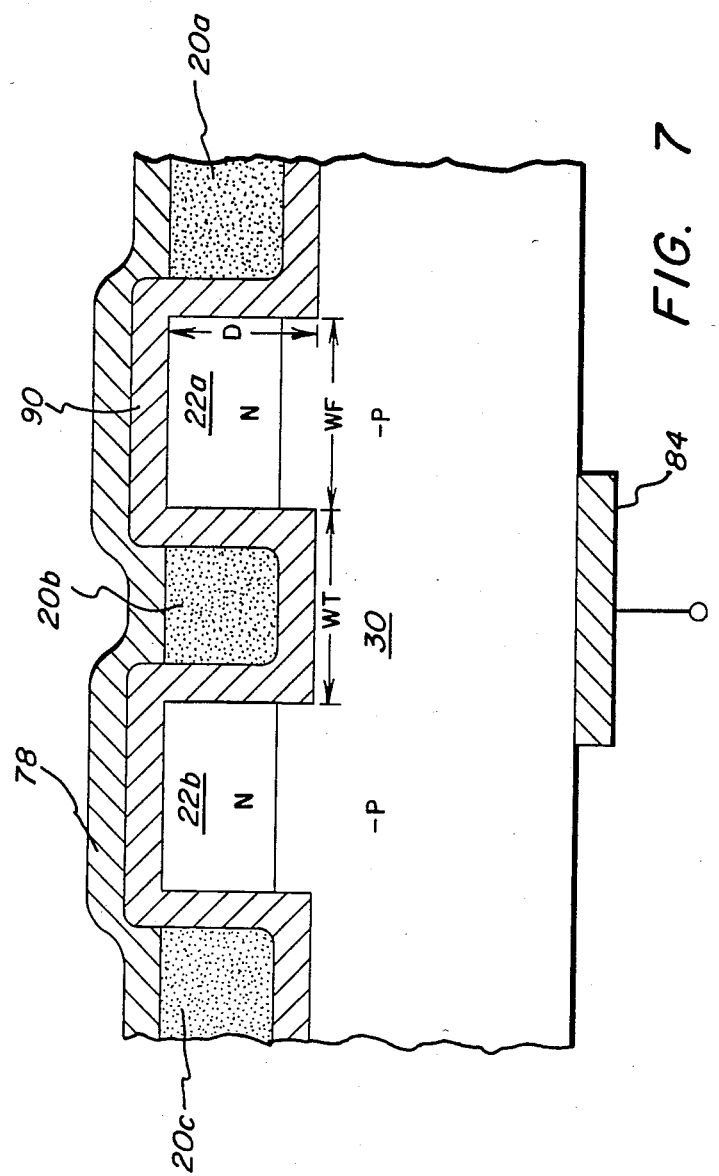
FIG. 7 is a cross-sectional illustration of a portion of a single cell of a lateral charge control semiconductor device taken along lines z—z of FIG. 4.

Referring now to FIG. 7, a cross-sectional illustration taken along the lines z—z of the lateral charge control semiconductor device 10 of FIG. 4 is shown. More particularly, trenches 20a and 20b define a first finger portion 22a of the second layer 32, while trenches 20b and 20c define finger portion 22b of the second layer 32. Each of the fingers has a depth D and a width WF. The trenches have the same depth D and a width WT. The spacing between sand the depth of the trenches is controlled to provide the fingers with a width-to-depth ratio WF/D of less than one. The finger portions 22a and 22b are surrounded on four surfaces by a charge control structure. More particularly, the trenches 20a and 20b and the gate material 64 insulatingly disposed therein provide charge control on the sides of finger 22a, while trenches 20b and 20c and the gate material 64 insulatingly disposed therein provide charge control on the sides of finger 22b. The first layer 30 provides charge control to the lower surface of the finger 22a while the field plate 78, in combination with the insulation layer 90, provides charge control on the upper surface of the fingers 22a and 22b. Thus, the doping concentration within the finger regions 22a and 22b can be increased without decreasing the breakdown potential of the device. This is because the charge control structures can be appropriately biased to couple to the electric field originating on the ionized impurities resident within the finger portions 22a and 22b to reorient these electric fields from their conventional orientation in the direction of on-state current flow to a direction substantially transverse to on-state current flow and thus prevent this electric field from contributing to a reduction of the breakdown potential of the device. Thus, the doping concentration within the fingers can be increased and during the off reverse biased state, the charge control structures can be activated to increase the breakdown potential. The lateral charge control structure of the present invention provides for reduced on-resistance in the on-state and a breakdown potential which is greater than the breakdown potential of the conventional device with the same doping concentration. Thus, the lateral charge control structure of the present invention provides for an improved semiconductor device.

Figure 8:
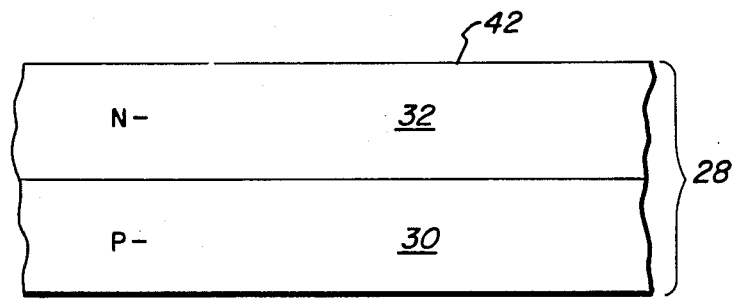
Figure 9:
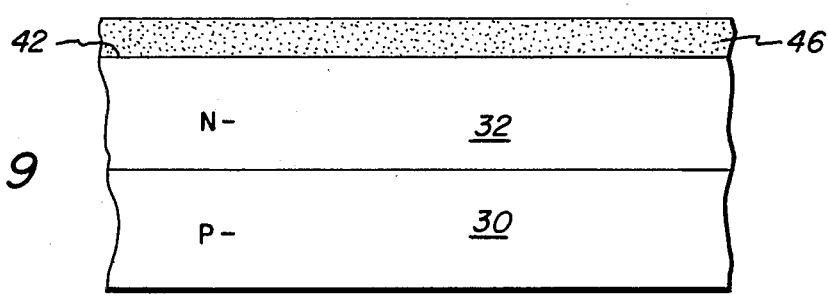

Referring now to FIGS. 8-43, a method of fabricating a lateral charge control semiconductor device in accordance with the present invention is shown. More particularly, as shown in FIG. 8, initially a partially processed semiconductor wafer 28 comprising a first layer 30 of one type conductivity and a second layer 32 of opposite type conductivity is provided. The first layer 30, shown as a P type layer, can be the substrate layer and the second layer 32, shown as an N type conductivity semiconductor layer, can be established on the P type layer 30 by either epitaxial growth or doping techniques. Alternatively, the second layer 32 can be the substrate layer and the first layer 30 can be established thereon by epitaxial growth or by doping the first layer 30 with appropriate techniques such as implantation or diffusion techniques. The second layer 32 has an upper surface 42 which is the first surface of the device 10. As shown in FIG. 9, an insulation layer 46 is disposed atop the second layer 32 on the first surface 42 of the device 10. It is preferred that the insulation layer 46 comprise an oxide such as silicon dioxide layer and have thickness of less than or approximately 100 nanometers. As shown, for instance, in FIG. 42 below, the insulation layer 46 can comprise a portion of the insulated gate structure 80 of the device 10.

Figure 10:
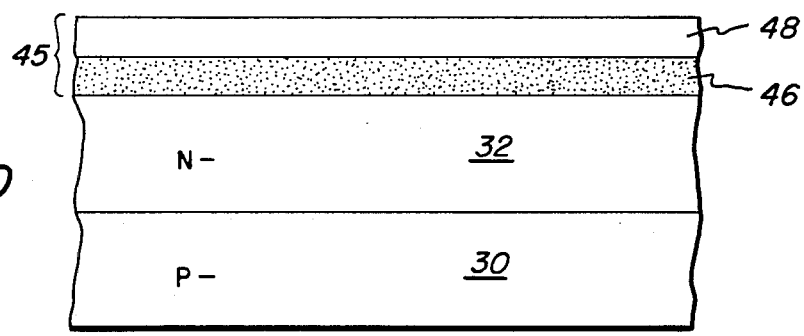

Referring now to FIG. 10, a passivating layer 48 is disposed atop the insulation layer 46. It is preferred that the passivating layer 48 prevent further oxidation of the underlying semiconductor layer 32. In the case of a silicon substrate, a nitride passivating layer 46 is appropriate. The passivating layer 46 can be relatively thin and be a nitride layer having a thickness of approximately 200 nanometers. Taken together, the insulating layer 46 and the passivating layer 47 can comprise the first protective layer 45 of the device.

Figure 11:
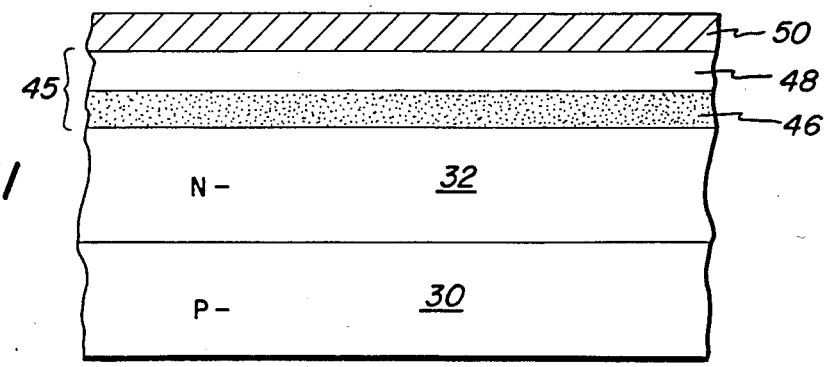

As shown in FIG. 11, a temporary protective layer 50, such as a polysilicon layer, is disposed atop the first protective layer 45. The polysilicon layer 50 is intended to function as a mask during subsequent implantation dopings of the second layer 32. Accordingly, the thickness of the temporary layer 50 should be sufficient to prevent spurious implantations from entering masked portions of the second layer 32. Thus, the thickness of the temporary protective layer is somewhat dependent upon the implantation energy to be employed, however, for most conventional purposes, a polysilicon layer having a thickness of approximately 500 nanometers is appropriate.

Figure 12:
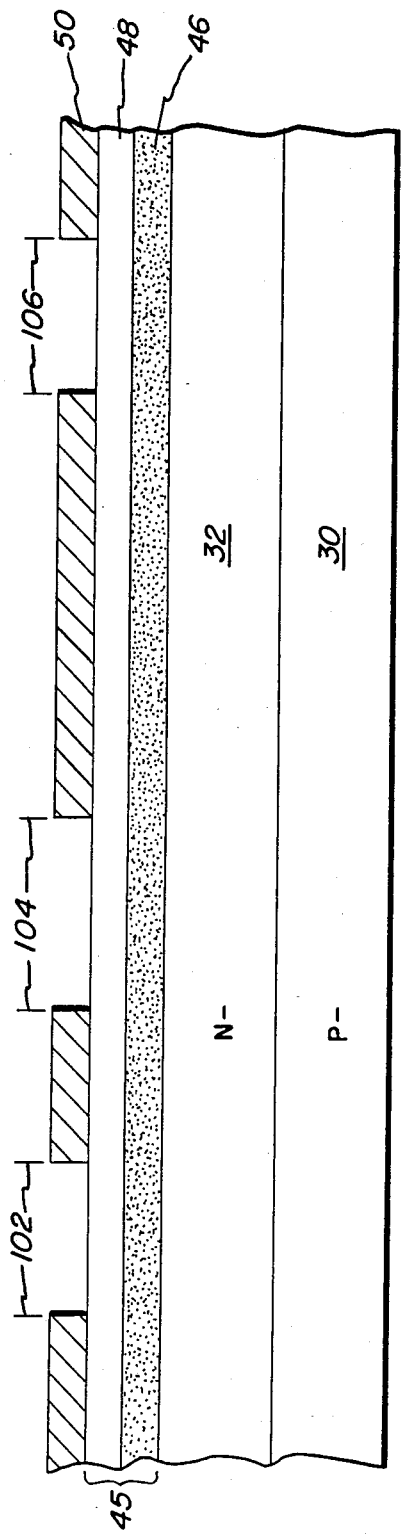

Referring now to FIG. 12, a first mask, in combination with photolithographic techniques, has been employed to open a first plurality of windows 100 comprising windows 102, 104 and 106. More particularly, a photolithographic mask be deposited on the surface of the temporary protective layer 50 and the unmasked portions of the polysilicon can be be removed by employing a reactive ion etch which attacks the polysilicon comprises the temporary layer, but not the underlying nitride. By using a single mask to establish both the first and third regions, 34 and 40, respectively, it is possible to establish these regions in a predefined relation so that the spacing or separation of these regions is accurately placed within the substrate.

Figure 13:
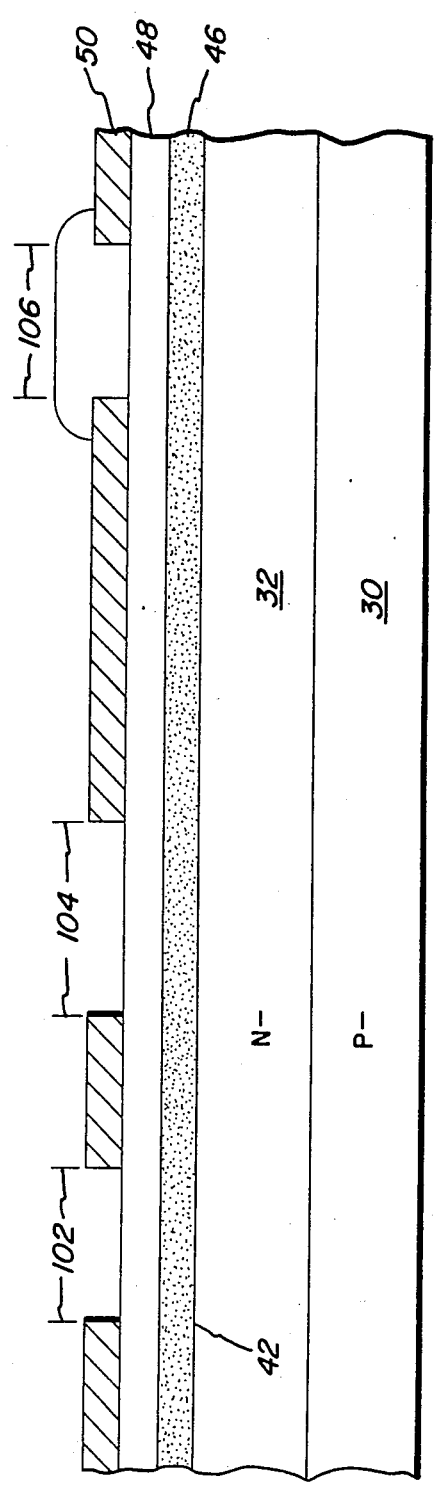

Hereinafter, and as shown in FIG. 13, the drain window 106 can be filled with a photoresist plug 107 to prevent the implantation of impurities through this window during the initial source implantations made to establish the first region.

Referring now to FIG. 14, one type conductivity dopants, such as boron atoms, can be implanted through the first windows 100 to establish two semi-cylindrical, substantially parallel one type conductivity regions 34 within the first layer 32, which are shown as P type conductivity regions. It is preferred that these regions exhibit a doping concentration approximately in the range of $5 \times 10^{16} - 5 \times 10^{17}$ atoms per cc. It is preferred that these regions overlap to form a continuous one type conductivity region which can be used to couple first and second back-to-back devices.

Figure 16:
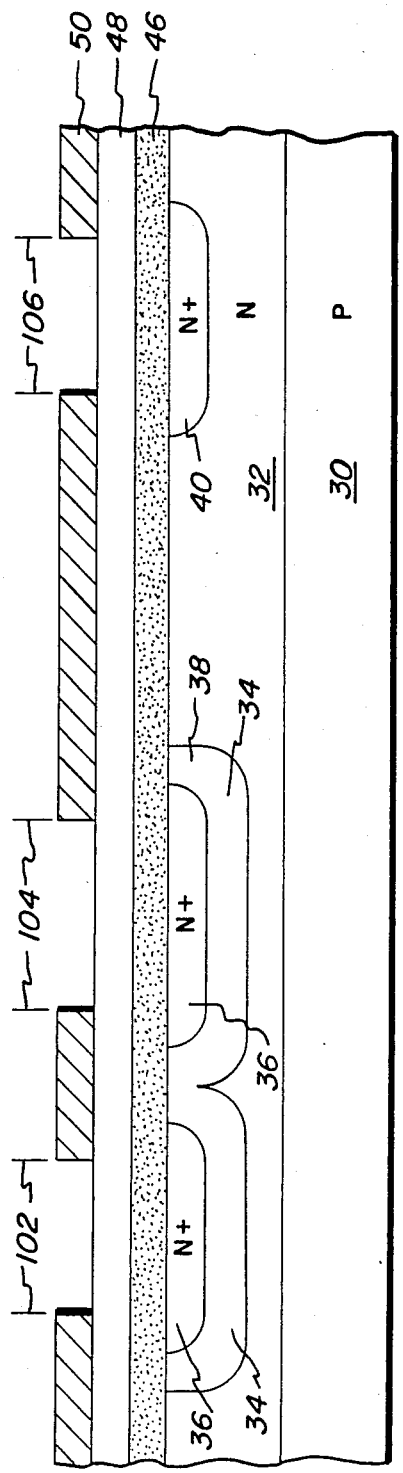

Subsequently, and as shown in FIG. 15, the drain window 106 can be re-opened by removing the photoresist plug 107 to re-expose the nitride layer 48. Thereafter, an implantation with opposite type conductivity dopants, such as phosphorous atoms is made to establish opposite type conductivity in the second and third regions 36 and 40, respectively, as shown in FIG. 16. More particularly, the opposite type conductivity regions 34 and 36, once implanted and driven, form heavily doped regions which can subsequently be used to establish ohmic contact to the device 10. The second region 36, in combination with the second layer 32, defines a channel portion 38 of the first region 34. By virtue of the mask used to establish the windows 100, 104 and 106, the third region or drain region 40 is established in predefined relation with the second or source region 36 and the first or base region 34.

Figure 17:
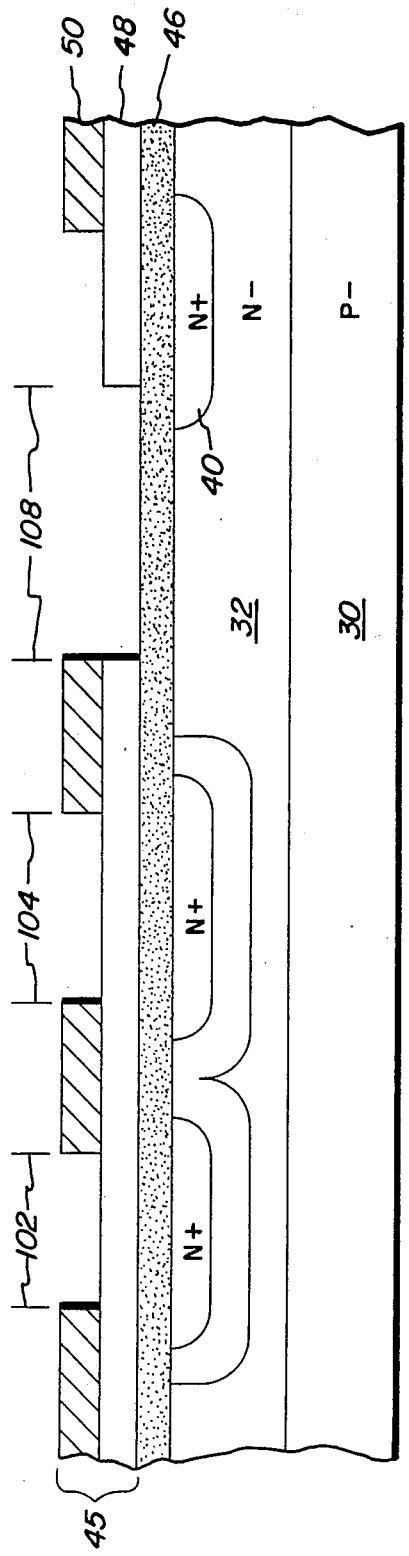

Referring now to FIG. 17, a second window 108 is opened through the temporary protective layer 50 and the underlying nitride layer 48 by employing conventional photolithographic techniques in combination with polysilicon and nitride specific etches. The second window 108 is located between the windows 104 and 106 and preferably overlaps window 106. Thus, window 108 contains only the oxide layer 46 comprising the first protective layer 45.

Subsequently, and as shown in FIG. 18, the remaining portion of the temporary protective layer 50 is removed by, for instance, in the illustrated example, employing a polysilicon etch. Thus, the exposed surface of the device 10 comprises a nitride layer 48 having a window 108 disposed therein which exposes the underlying insulation layer 46.

Thereafter, and as shown in FIG. 19, a mask layer 110 which comprises a suitable material such as aluminum resist, the etchant which will be subsequently employed to etch a trench through the silicon is deposited on the exposed surface of the device 10. The mask layer 110 can be photolithographically patterned to form a mask which resists the etch which will be subsequently employed to etch the trench in a silicon.

Figure 20:
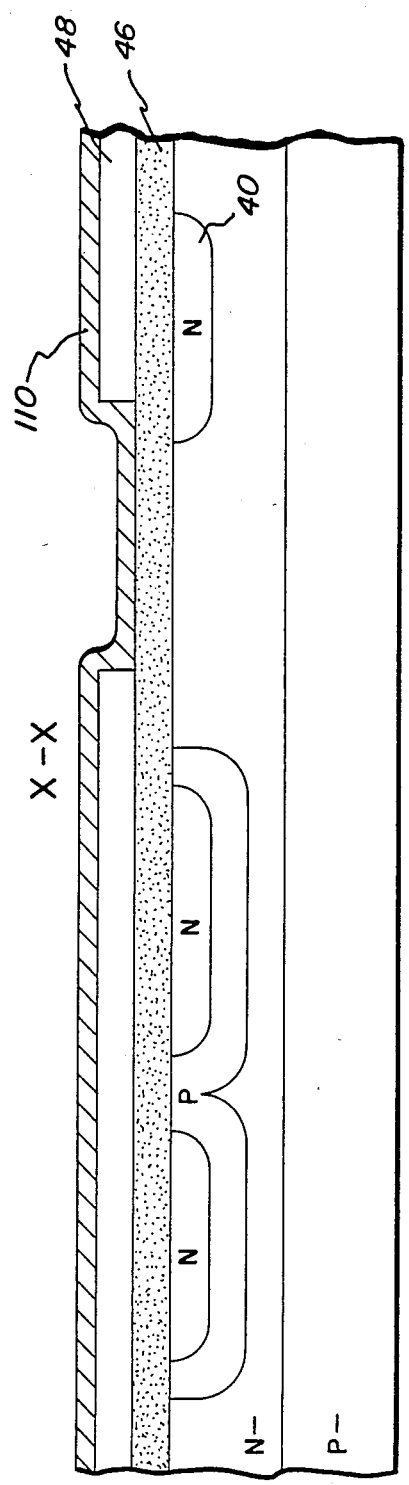
Figure 21:
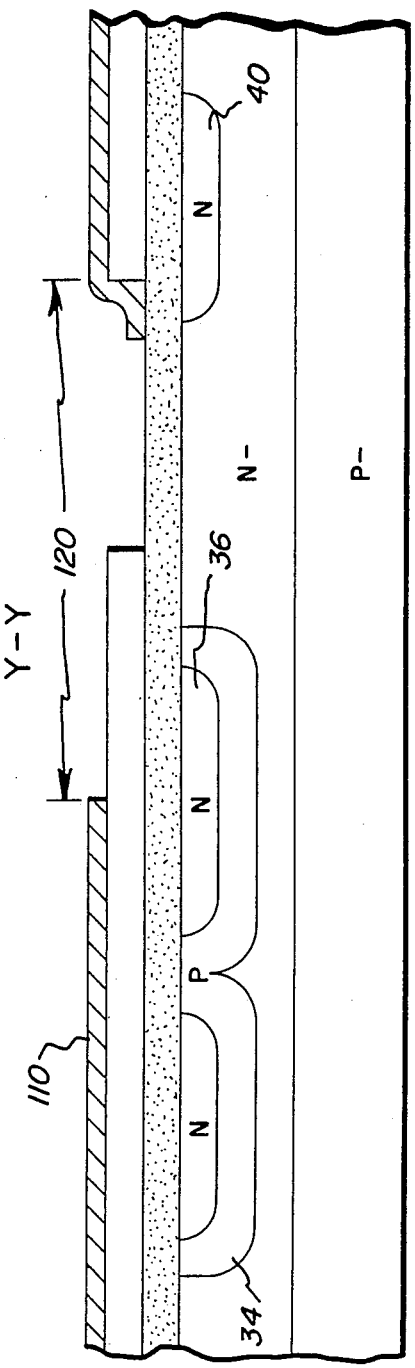

Referring now to FIGS. 20 and 21, in combination with the aforedescribed FIGS. 1 and 4, given the nature of the fabrication of the present device, it is now necessary to follow the fabrication of the device simultaneously from two distinct viewpoints. The first viewpoint is shown in the even number FIGS. 20-42, shows cross-sectional illustrations taken along lines x—x of FIGS. 1 and 4 or through the finger portion during the fabrication of the device. The odd number FIGS. 21-43 show a second cross-sectional viewpoint which may be taken along the lines y—y of FIG. 1 and FIG. 4 during the fabrication of the devices thereof and show a cross-sectional view taken along the trench portion of the device. Thus, by referring simultaneously to the even and odd numbered figures, it is possible to simultaneously understand how the finger and trench portions of the device 10 are being processed at the same time.

Referring now to FIGS. 20 and 21, a trench window 120 is opened through the mask layer 110 shown in FIG. 21, but not through the portion of the mask layer 110 shown in FIG. 20. Thus, the trench window is long and narrow and extends only over the trench portion 20 of the device, but not over the finger portion 22 of the device 10. Further, it should be noted that the trench window 120 extends proximate the drain region 40 and can preferably does not overlap the drain region 40. However, the trench window 120 also encompasses a portion of the first and second regions 34 and 36, respectively.

Thereafter, as shown in FIGS. 22 and 23, the unmasked portion of the semiconductor device 10 is then etched with an appropriate etch such as a reactive ion to establish a trench 20 extending through the second layer 32 and into the first layer 30. The trench impinges upon and extends through a portion of the first region 34 and the second region 36.

Thereafter and as shown in FIGS. 24 and 25, the mask layer 110 is removed by, for instance, employing a wet chemical or reactive ion type etch to re-expose the nitride layer 48 and the underlying insulation layer 46.

Figure 26:
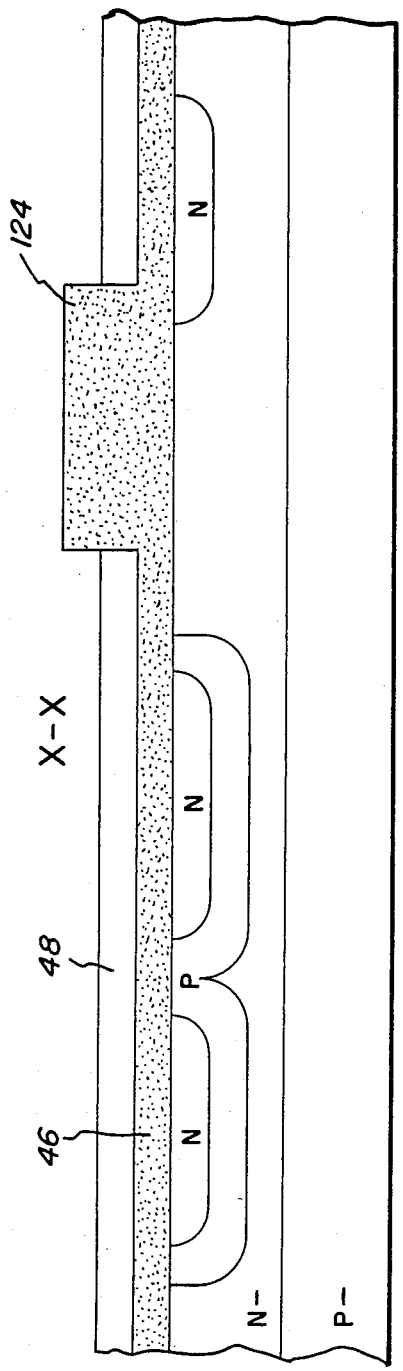
Figure 27:
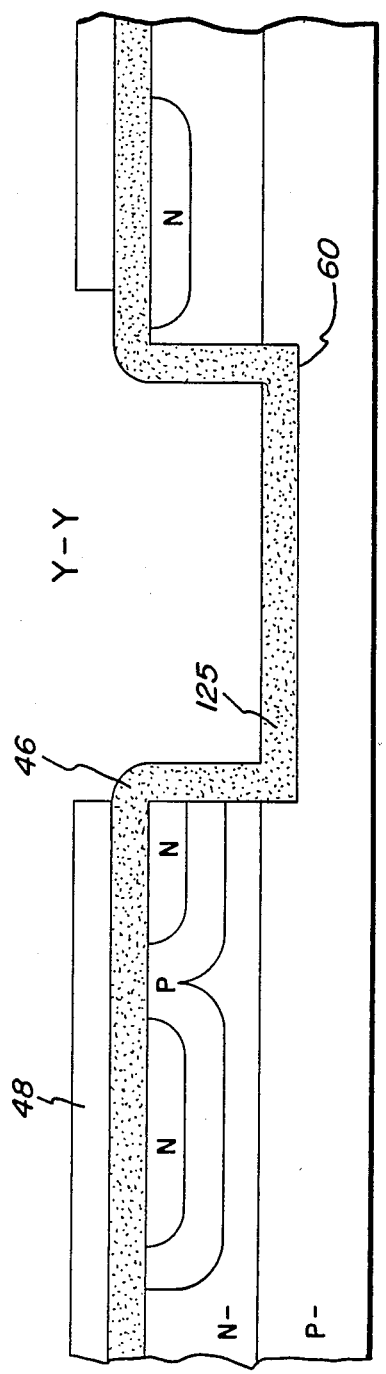

The exposed surfaces of the device is then exposed to an oxidation environment whereby an oxide layer is grown on the exposed oxidizable surfaces. More particularly, as shown in FIG. 26, an additional oxide layer 124 is grown within the field plate window 108 atop the exposed oxide layer 46. The oxide layer 124 does not grow atop the nitride layer 48 because the nitride layer 48 passivates the surface of the device and prevents oxidation therethrough. As shown in FIG. 27, an oxide layer 125 is grown on the exposed surface of the trench 20. It is preferred that the oxide layers 124 and 125 have thickness which is suited to the voltage of the device. For instance, a 60 volt layers 245 and 125 will have a approximately in the range of 200 nanometers. Thereafter, as shown in FIGS. 28 and 29, an additional nitride layer 128 is deposited on the exposed surface of the device 10 to encapsulate the previously deposited field oxide layer 124 and the trench oxide layer 125.

Figure 34:
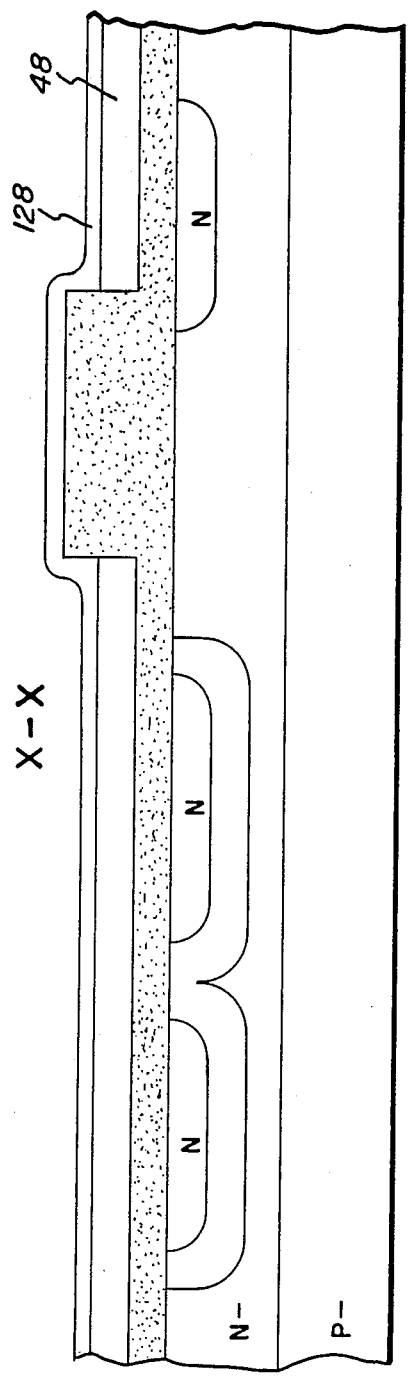
Figure 35:
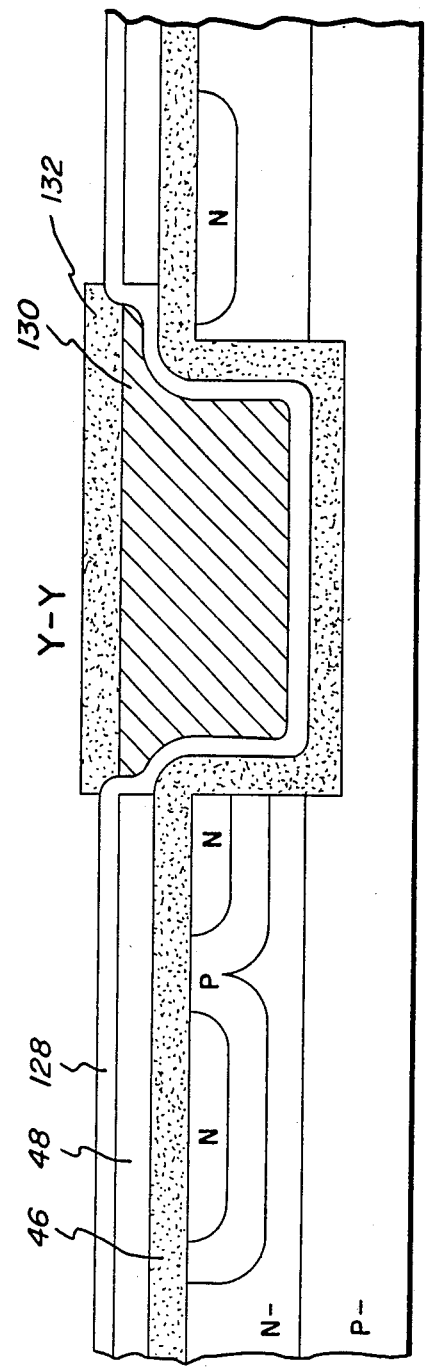

As shown in FIGS. 30 and 31, a layer of polysilicon is then deposited on the exposed surface of the device 10 in a thickness sufficient to fill the trench 20. Thereafter the deposited polysilicon 130 is replanarized to re-expose the previously deposited nitride layer 128 on the upper surface of the device and to leave the trench 20 filled with gate material 130 as shown in FIGS. 32 and 33. Subsequently, the exposed surface of the device is exposed to an oxidation environment whereby an oxide layer 132 grows atop the oxidizable gate material 130 as shown in FIGS. 34 and 35. As shown in FIG. 34, that an oxide layer does not grow on the other portions of the device inasmuch as these are covered with a nitride layer 128.

Figure 36:
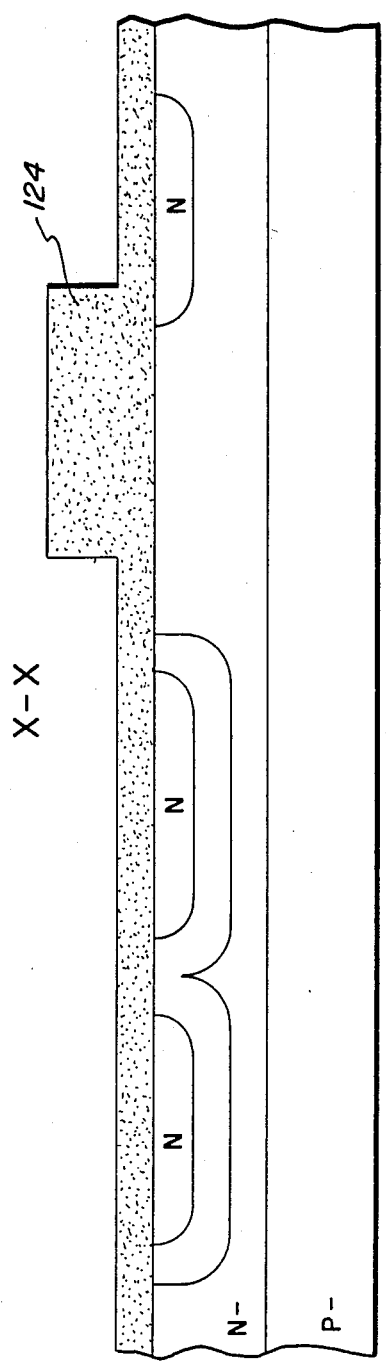
Figure 37:
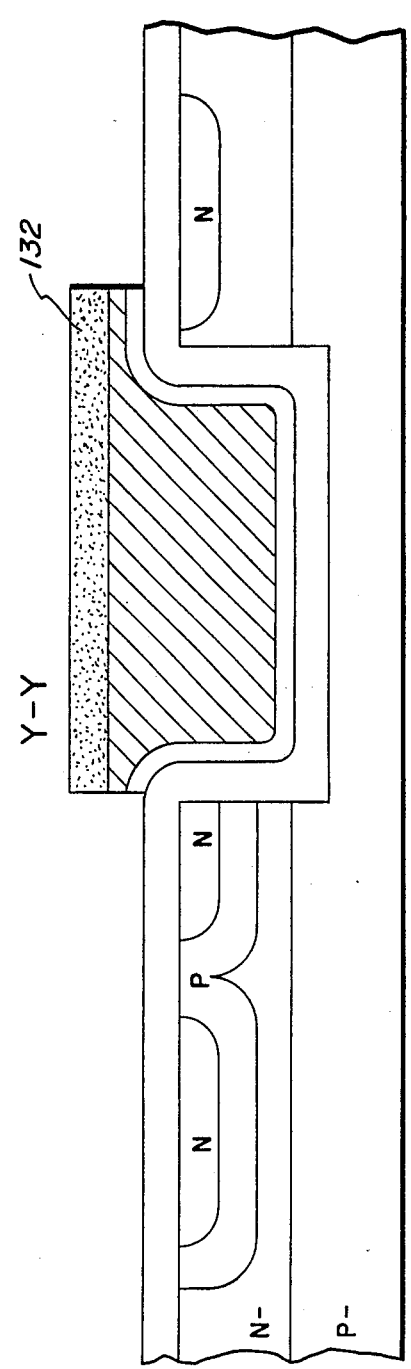

Referring now to FIGS. 36 and 37, the exposed nitride layer 128 and the underlying nitride layer portion 48 of the first protective layer 45 is removed by employing a nitride specific etch, such as hot phosphoric acid. Consequently, the upper surface of the device comprises an oxide layer 46 as well as a field oxide 124 and a trench oxide 132.

As shown in FIGS. 38 and 39, contact windows are opened through the exposed oxide layers. More particularly, a source contact window 140 is opened through the oxide layer 48. The source contact window extends substantially parallel to the longitudinal axis of the first and second regions 34 and 36, respectively, and substantially transverse to the longitudinal axis of the trench 20. Similarly, a drain, or third region contact window 142 is also opened through the oxide layer 48. The longitudinal axis of the drain contact window 142 extends substantially parallel to the longitudinal axis of the drain region and substantially transverse to the longitudinal axis of the trench region 20. As shown in FIG. 39, a trench poly contact window 144 is also opened through the trench insulation layer 132. Each of the windows 140, 142, and 144 can be opened through the oxide layer 48 by, for instance, employing photolithographic techniques in combination with an appropriately designed mask and an appropriate etch such as buffered hydrofluoric acid.

Referring now to FIGS. 40 and 41, a metallization layer 150 is deposited on the exposed surface of the device. More particularly, as shown in FIG. 40, the metallization layer contacts the first and second regions 34 and 36 as well as the third region 40. In addition, as shown in FIG. 41, the metallization layer 150 contacts the first, second and third regions 34, 36 and 40 as well as the gate poly 130 through the contact windows 140, 142 and 144, respectively.

Thereafter, and referring to FIGS. 42 and 43, the metallization layer can be patterned employing photolithographic techniques in combination with an appropriate mask. More particularly, as shown in FIG. 42, the metallization layer 150 is divided into a plurality of separate regions. A first region 152 forms the source contact region while a second portion 154 overlies the insulation layer 48, itself overlying the channel portion 38 of the first region 34. A third portion 156 of the metallization layer 150 is situated atop the field oxide 124 and forms a field plate extending over the drain or drift region of the device. A fourth portion 158 of the metallization layer 150, extends into the drain contact window 142 and makes ohmic contact with the exposed surface of the drain region 40. In addition, a fifth portion 160 of the metallization layer 150 is disposed within the trench poly contact window 144 and makes ohmic contact with the trench poly 130 disposed therein.

It is to be recognized that while the preferred embodiments of the lateral charge control semiconductor device and a method of fabricating a lateral charge control semiconductor device have been disclosed with respect to a metal oxide semiconductor field effect transistor, the present invention can be employed to establish any number of semiconductor devices such as insulated gate transistors, junction transistors, insulated gate thyristors, Schottky and junction diodes. In each of these devices, the dopant concentration of the drift region can be increased without increasing the breakdown potential of the device. Alternatively, the length of the drift region can be reduced to lower the forward voltage drop or increase the speed of the device. These benefits are particularly important in devices which do not require large breakdown voltage. Thus, insulated gate transistors can be fabricated with lower forward drops and MOS controlled thyristors can be fabricated with higher peak voltages. Further, the self-aligned techniques of the present invention can be employed to provide more precisely aligned devices requiring less tolerance for misalignment. Hence, the disclosed method makes maximum use of available semiconductor chip area to improve cell density, reduce cell size and cell repeat distance.

While the preferred embodiments of the present invention have been illustrated and described, it is clear that the invention is not so limited. Numerous modifications and changes, variations and substitutions and equivalents will occur to those skilled in the art without departing from the true spirit and scope of the present invention. Accordingly, it is intended that the invention herein be limited only by the scope of the appended claims.

What is claimed is:

1. A semiconductor device comprising a semiconductor wafer including:
   first and second layers, said first layer being of one type conductivity and said second layer being of an opposite type conductivity;
   a first region of one type conductivity established within said second layer;
   a second region of opposite type conductivity disposed within said first region;
   a plurality of trenches disposed in said second layer extending through said first and second regions and said second layer and into said first layer;
   a first insulated gate disposed in each of said trenches;
   a second insulated gate disposed over a portion of said first region; and
   a field plate comprising an insulated gate structure disposed atop said first layer in the interstices of said plurality of trenches.

2. The semiconductor device of claim 1 wherein said first and second regions are semi-cylindrical and have first and second primary axes, respectively.

3. The semiconductor device of claim 2 wherein said first and seocnd primary axes are substantially parallel to each other.

4. The semiconductor device of claim 3 wherein each of said trenches has a primary axis which is substantially transverse to said first primary axis.

5. The semiconductor device of claim 1 further including a drian region of opposite type conductivity disposed within said first layer.

6. The semiconductor device of claim 5 wherein each of said trenches is spaced from said drain region.

7. The semiconductor device of claim 1 wherein said plurality of trenches are arranged in a side-by-side relation with adjacent trenches defining a finger portion of the first layer therebetween.

8. The semiconductor device of claim 7 wherein said finger portion has width WF and a depth D such taht the ration of WF to D is less than 1.

9. The semiconductor device of claim 7 wherien said finger portion has a length L which is greater than or equal to 10 microns and the device has a breakdown voltage in excess of 400 volts.

10. The semiconductor device of claim 1 wherein said second layer comprises a plurality of finger portions interdigitated with said plurality of trenches.

11. The semiconductor device of claim 10 wherein each of said trenches has a width WT and said finger portion has width WF and wheeein the ratio of WT/WF is less than or equal to 1.

12. The semiconductor device of claim 10 wherein the finger portion of said second layer exhibits a heavy doping concentration to reduce the on-resistance thereof, and said insulated gate disposed in said trenches, under reverse bias conditions, coupling the electric field associated with the ionized impurities of the second layer adjacent said trench to control the electric field and increase the reverse blocking capability of said device.

13. The semiconductor device of claim 1 wherein said second region extends to a first depth and one of said trenches extends to a depth substantially greater than said first depth.

14. The semiconductor device of claim 1 wherein said first insulated gate comprises a first insualtion layer disposed on the interior surface of said trench and a gate electrode is disposed atop said insulation layer.

15. The semiconductor device of claim 1 wherein said field plate comprises a metallization layer atop a thick oxide layer disposed on a the first surface of said first layer.

16. The semiconductor device of claim 1 further comprising:
   a first electrode ohmically connected to said second layer; and
   a second electrode ohmically connected to said second region.

17. The semiconductor device of claim 16 further comprising:
   a third electrode ohmically connected to said first layer.

18. A semiconductor device comprising:
   A semiconductor wafer including:
   a first layer of semiconductor material of one type conductivity;
   a second layer of opposite type conductivity dispposed adjacent to and forming a PN junction with said first layer;
   a first region of one type conductivity disposed within said second layer;
   a second region of opposite type conducitivity disposed within said first region;
   a third region of said opposite type conductivity disposed within said second layer and having a higher conductivity than the rest of said second layer;
   a plurality of substantially parallel trenches extending into said semiconductor wafer from an upper surface thereof and extending through portions of said first and seocnd regions and said second layer and into said first layer;
   a first insulated gate electrode having a plurality of segments each disposed in one of said trenches;
   a second insulated gate electrode disposed over said first region to control the conductivity of a channel region extending from said second region to said second layer through said first region; and
   a field plate comprising an insulated gate structure disposed over portions of said first layer which space apart said trenches.

19. The semiconductor device of claim 18 further comprising:

a first electrode ohmically connected to said first layer;

a second electrode ohmically connected to said second region; and a third electrode ohmically connected to said third region whereby the portions of said second layer which are disposed between adjacent trenches are subject to charge control along opposite sides thereof from said first insulated gate electrode, along the upper surface thereof from said field plate and along the lower surface thereof from said first layer.

* * * * *